(12) United States Patent
Laine et al.

(10) Patent No.: US 7,915,369 B2
(45) Date of Patent: Mar. 29, 2011

(54) ULTRAVIOLET TRANSMISSIVE POLYHEDRAL SILSESQUIOXANE POLYMERS

(75) Inventors: Richard M. Laine, Ann Arbor, MI (US); Lisa Viculis, Placentia, CA (US); Norihiro Takamura, Osaka (JP); Ken-ichi Shinotani, Katano (JP)

(73) Assignees: Panasonic Electric Works Co., Ltd., Osaka (JP); The Regents of the University of Michigan, Ann Arbor, MI (US)

( * ) Notice: Subject to any disclaimer, the term of this patent is extended or adjusted under 35 U.S.C. 154(b) by 969 days.

(21) Appl. No.: 11/075,042

(22) Filed: Mar. 8, 2005

(65) Prior Publication Data
US 2006/0122351 A1    Jun. 8, 2006

Related U.S. Application Data

(60) Provisional application No. 60/633,821, filed on Dec. 7, 2004.

(51) Int. Cl.
*C08G 77/08*    (2006.01)
(52) U.S. Cl. ............... 528/15; 528/31; 528/32; 528/37
(58) Field of Classification Search .............. 528/15, 528/31, 32, 37
See application file for complete search history.

(56) References Cited

U.S. PATENT DOCUMENTS

| | | | |
|---|---|---|---|
| 5,047,492 A * | 9/1991 | Weidner et al. ............... 528/15 |
| 5,330,734 A | 7/1994 | Johnson et al. |
| 5,618,878 A | 4/1997 | Syktich et al. |
| 5,939,576 A * | 8/1999 | Lichtenhan et al. ......... 556/460 |
| 6,911,518 B2 * | 6/2005 | Lichtenhan et al. ........... 528/15 |
| 7,223,517 B2 * | 5/2007 | Babich et al. ............. 430/270.1 |
| 2002/0090572 A1 | 7/2002 | Sooriyakumaran et al. |
| 2005/0142054 A1 * | 6/2005 | Hasegawa et al. ........... 423/325 |

FOREIGN PATENT DOCUMENTS

| | | |
|---|---|---|
| DE | 38 37 397 A1 | 5/1990 |
| EP | 0 736 584 A2 | 10/1996 |
| EP | 0 736 584 A3 | 10/1996 |
| JP | 8-325521 A | 12/1996 |
| JP | 2004-359933 A | 12/2004 |
| JP | 2006-518798 A | 8/2006 |
| WO | WO-03/102695 A1 | 12/2003 |
| WO | WO-2004/076175 A1 | 9/2004 |

OTHER PUBLICATIONS

D. Hoebbel et al., Zeitschrift Für Anorganische Und Allgemeine Chemie, 384, pp. 43-52 (1971).
I. Hasegawa et al., Journal of Molecular Liquids, 34, pp. 307-315 (1987).
Hasegawa et al., J. Organometallic Chem., 441, pp. 373 (1992).
D. Hoebbel et al., Allg. Chem. 418, pp. 35-45 (1975).
D. Hoebbel, et al., Allg. Chem. 521, pp. 61-68 (1985).
D. Hoebbel et al., Allg. Chem. 576, pp. 160-168 (1989).
I. Hasegawa et al., Sol-Gel Sci. and Tech. 1, pp. 57-63 (1993).
I. Hasegawa et al., Appl. Organometallic Chem. 13, pp. 237-277 (1999).
Laine, Richard M. et al., "Polyfunctional Cubic Silsesquioxanes as Building Blocks for Organic/Inorganic Hybrids", Applied Organometallic Chemistry, 1998, vol. 12, pp. 715-723.
Sellinger, Alan et al., "Silsesquioxanes as Synthetic Platforms, Thermally Curable and Photocurable Inorganic/Organic Hybrids", Macromolecules, 1996, vol. 29, No. 6, pp. 2327-2330.
Notification of Reasons for Refusal for the Application No. 2007-526863 from Japan Patent Office mailed Aug. 17, 2010.

* cited by examiner

*Primary Examiner* — Margaret G Moore
(74) *Attorney, Agent, or Firm* — Cheng Law Group, PLLC

(57) ABSTRACT

Inorganic/organic hybrid polymers containing silsesquioxane cages are robust and exhibit desirable physical properties such as strength, hardness, and optical transparency at infrared and ultraviolet wavelengths. The polymers are prepared by polymerizing functionalized polyhedral silsesquioxane monomers such as polyhedral silsesquioxanes bearing two complementarily reactive functional groups bonded to cage silicon atoms by means of spacer moieties. The spacer moieties allow for steric mobility and more complete cure than polyhedral silsesquioxanes bearing reactive functional groups bound directly to cage silicon atoms.

16 Claims, 2 Drawing Sheets

ULTRAVIOLET TRANSMISSIVE POLYHEDRAL SILSESQUIOXANE POLYMERS

CROSS-REFERENCE TO RELATED APPLICATION

This application claims the benefit of U.S. provisional application Ser. No. 60/633,821 filed Dec, 7, 2004.

BACKGROUND OF THE INVENTION

1. Field of the Invention

The present invention pertains to novel silsesquioxane polymer precursors, to methods of preparing them, and to ultraviolet transmissive polymers prepared therefrom.

2. Background Art

Transparent polymers are widely used. Polymers exhibit distinct processing advantages over other transparent media such as glasses, including fused or vitreous silica, and crystalline substances such as calcium fluorite. Polymers may be thermoplastic, i.e. melt processable, or may be thermoset, i.e. curing to a non-thermoplastic state by means of crosslinking. Hybrid polymers, for example those which are initially thermoplastic but which further crosslink upon heating, exposure to light, or over time, are also available.

From a process standpoint, organic based materials are desirable since they are compatible with low-temperature processing. Accordingly, the development of transparent materials that possess both advantages of organic and inorganic materials is becoming important. In other words, materials that have high transparency and durability to short wavelength light (advantages of inorganic materials) and ease of processing at low temperatures (advantages of organic materials) are needed.

Many applications require polymers which are robust, which are abrasion resistant, which have low coefficients of thermal expansion and refractive index, and which are transmissive over the required portion of the spectrum. Ordinary glass, for example, is transmissive over the visible region and partially into the infrared (IR) and ultraviolet (UV) regions of the spectrum. However, for emissive or responsive devices which operate further in the IR or UV, quartz or fused silica must be used. These materials are difficult to fabricate.

Polymers previously used for such applications, such as transparent epoxy resins, polyesters, polyacrylates, and organopolysiloxanes may have unwanted absorbtion peaks in the spectral areas of interest due to their chemical linkages and the presence of absorbing groups. Many of these materials do not transmit appreciably in the IR and/or UV areas of the spectrum. Importantly, these polymers also suffer from lack of abrasion resistance, and have undesirably high coefficients of thermal expansion and refractive index. Thus, while being quite processable, their optical and physical properties are less than desired.

Silsesquioxanes as polyhedral structures are generally known. Silsesquioxanes may be prepared by hydrolysis of trifunctional silanes such as $A_3SiB$ where A is an alkoxy group or halogen and B is a functional or non-functional group, for example an alkyl group, vinyl group, or hydrogen. While polyhedral molecules can result from conventional synthetic methods, the primary products are generally highly crosslinked resins which are soluble in apolar solvents such as toluene. The resins may be cured by reaction with interreactive functional monomers to produce a wide variety of products. For example, Si—H functional resins may be cured with divinyl compounds. However, the products are generally high molecular weight elastomers or solids, and often contain numerous unreacted functional groups, even when reacted in solution.

Resinous silsesquioxanes are known from U.S. Pat. No. 5,047,492, and have been cited as of academic interest as well. Some of these products may contain polyhedral silsesquioxanes. However, when polyhedral silsesquioxanes are functionalized directly at a cage silicon atom, i.e. when functional groups R in FIG. 1 are vinyl or H, the spatial arrangement of functional groups and their close proximity to the inflexible cage renders their reaction incomplete. This is particularly the case since prior functionalized silsesquioxanes have been completely functionalized, i.e. in silsesquioxane cages containing eight silicon atoms, each silicon bears the same reactive functional group. Unreacted groups can later react, altering the properties of the product, or may enter into a variety of degradation reactions, for example oxidizing to produce colored species or hydrolyzing to produce hydrolysis products as inclusions, which decreases transparency.

It would be desirable to provide easily processable polymers which do not have the above identified deficiencies, all or in part.

SUMMARY OF THE INVENTION

It has now been surprisingly discovered that polymers based on polyhedral silsesquioxanes which are functionalized via spacer moieties at the cage silicon atoms are highly transmissive in the UV region of the spectrum, and exhibit desirable properties such as abrasion resistance and easy processability as well. The preferably incompletely functionalized silsesquioxanes are easily prepared, and when suitably purified, offer a long shelf life.

DETAILED DESCRIPTION OF THE PREFERRED EMBODIMENT(S)

Figure 1:
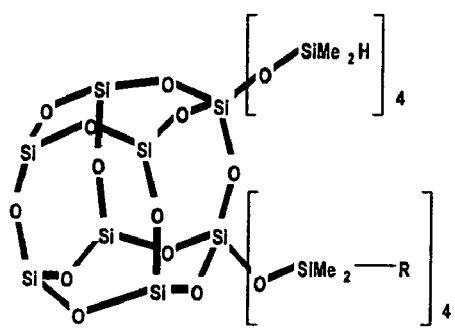
FIG. 1 illustrates a preferred embodiment of incompletely functionalized polyhedral silsesquioxane polymer precursor.
Figure 1:
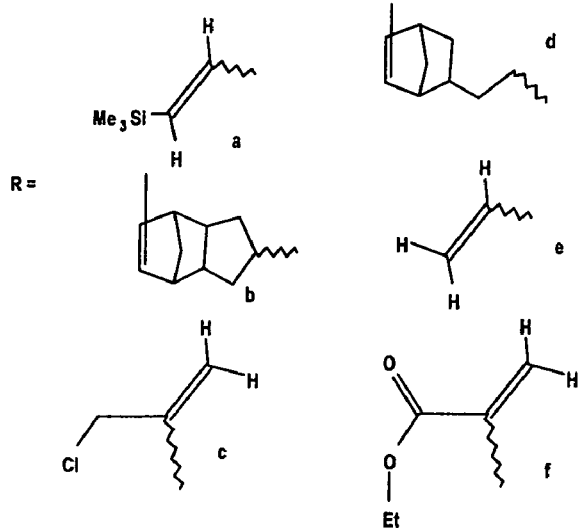
Figure 2:
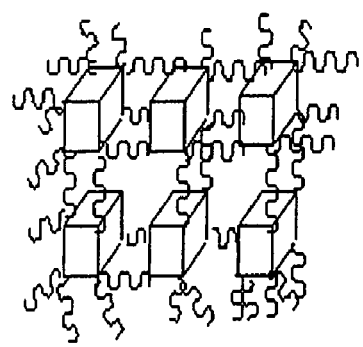
FIG. 2 illustrates schematically a polymer prepared from incompletely functionalized precursors.

The subject invention is directed to polyhedral silsesquioxanes which bear functional groups attached to cage silicon atoms via spacer moieties which provide the functional groups with steric mobility such that a higher portion of functional groups can react. Preferably, the polyhedral silsesquioxanes are incompletely functionalized such that on average, each molecule bears from about 20 to 80 mol percent, more preferably from 30 to 70 mol percent, and most preferably from 40 to 60 mol percent of functionalized cage silicon atoms, as more fully detailed hereafter. For example, in $Si_8$ silsesquioxanes cages, it is preferable that on average 2 to 6, more preferably 3 to 5, and most preferably about 4 Si atoms are functionalized with a given type of reactive functionality linked to the cage Si atoms via spacer moieties.

The subject invention is also directed to novel UV transmissive polymers which may be prepared from the inventive, partially functionalized polyhedral silsesquioxanes, or from completely functionalized silsesquioxanes where at least a portion of the reactive functionalities are bonded to cage silicon atoms via spacer molecules.

The polyhedral silsesquioxanes have the general formula $Si_nO_{1.5n}$ where n is from 6-12, and most preferably 8. The actual Si/O stoichiometry can vary somewhat from the 1:3 ratio of the formula given, either due to the presence of unavoidable impurities, or the purposeful presence of $SiO_{2/2}$ or $SiO_{4/2}$ units. In addition, cages may be incomplete (i.e. have an open side) due to incomplete reaction, cleavage, or the presence of unavoidable or purposefully introduced monofunctional groups $SiO_{1/2}$. In the $SiO_{2/2}$, $SiO_{4/2}$, and $SiO_{1/2}$ moieties, the remaining valencies of the tetravalent silicon are satisfied by organic groups, hydrogen, halogen, etc.

When $SiO_{4/2}$ groups are purposefully added, for example during preparation of the silsesquioxanes in the form of tetrafunctional silanes such as $SiCl_4$ and $(MeO)_4Si$, the amounts should be less than 20 mol percent, more preferably less than 10 mol percent, and most preferably less than 5 mol percent relative to the content of trifunctional $SiO_{3/2}$ moieties. Preferably, no $SiO_{4/2}$ moieties other than those introduced by unavoidable impurities or side reactions are present.

A very minor portion of $SiO_{2/2}$ moieties may also be present, for example less than 5 mol percent, preferably less than 3 mol percent, and most preferably 2 mol percent or less, again based on the content of $SiO_{3/2}$ moieties. Preferably, substantially no $SiO_{2/2}$ groups are present. Such groups derived from unavoidable impurities are acceptable. The presence of $SiO_{2/2}$ groups may have two different effects. In a first case, these groups may extend the length of one or more "edges" of a polyhedral silsesquioxanes structure. In such cases, a cage "side" may be a pentagon or hexagon (with respect to Si) with the $SiO_{2/2}$ group at a non-three dimensionally bound apex of the polygon. Such products are perfectly acceptable so long as the amount of $SiO_{2/2}$ groups is not inordinately large. Such products can tolerate more than 5 mol percent of $SiO_{2/2}$ units. However, if the $SiO_{2/2}$ groups react with themselves to form oligomeric chains $(SiO_{2/2})_m$ where m>3, or where they serve to link two or more polyhedral silsesquioxanes together, the polymerized product may lose its rigidity and hardness, and may also generate regions within the polymer which will scatter light, particularly of short wavelengths, reducing the transmission of light under these conditions. Thus, if the mode of synthesis of the silsesquioxanes cage can lead to such products, then the presence of $SiO_{2/2}$ units is desirably quite low, and preferably substantially no such units are present.

The amounts of $SiO_{4/2}$ groups discussed above are relative to tetrafunctional monomers, i.e. tetrahalosilanes or tetraalkoxysilanes introduced during the synthesis of silsesquioxanes cage structures, and not to fully reacted, i.e. $SiO_2$ units which may be present when the silsesquioxanes are prepared from silica sources such as precipitated or fumed silicas, fly ash, rice hull ash, etc. In these sources, it is likely that the $SiO_{4/2}$ units (as $SiO_2$) are already present in fully or partially polyhedral structures.

The polyhedral silsesquioxanes used to prepare the inventive polymers must be functionalized with reactive, i.e. polymerizable groups, at least a portion of which must be bound to the Si atoms of the polyhedral silsesquioxanes by spacer moieties. The reactive functional groups may vary widely, and in principle include all reactive groups which may be used to chain extend or crosslink silicon-containing monomers or oligomers to produce organopolysiloxane or organocarbosiloxane products. For example, but not by limitation, such groups may be susceptible to reaction by addition, hydrosilylation, or condensation. Non-limiting examples include Si—H groups, unsaturated hydrocarbon groups, groups capable of Michael addition to double bonds, hydrolyzable groups such as Si—OH, SiX where X is halogen, preferably chlorine, or Si—OR where R is a hydrocarbon group, preferably an alkyl group.

The polyhedral silsesquioxanes may contain a single type of reactive group or more than one type of reactive group. When more than one type of reactive group is present, it is desirable that the types of reactive groups are complementarily reactive, i.e. interreactive. In such cases, one of the reactive groups may optionally be directly bonded to a silicon atom of the polyhedral silsesquioxanes molecule, i.e. with no spacer moiety.

Examples of reactive groups include ethylenically and ethylynically unsaturated hydrocarbons such as vinyl, allyl, 2-propenyl, isopropenyl, 3-butenyl, 2-butenyl, 5-hexenyl, cycloalkenyl, for example cyclopentenyl, cyclohexenyl, norbornenyl, acetylenyl, 3-hexynyl, acryloyloxy, methacryloyloxy, etc. When vinyl groups are present, these must not be directly linked to a cage Si atom unless the polymerizable mixture also contains complementarily reactive groups on the same or different molecule linked to cage Si atoms via a spacer moiety.

Silicon-bonded hydrogen (Si—H) are also suitable reactive groups when a complementarily reactive group such as an unsaturated hydrocarbon group, Si-alkoxy group, silanol (Si—OH) group, oximino group, acetoxy group, or the like group is present. When complementarily reactive groups are present and all or in part are bonded to cage Si atoms by a spacer moiety, the hydrogens of the Si—H groups may be bonded directly to a cage Si atom. Alternatively, and preferably, the hydrogen atoms of the Si—H group may be bonded to a cage Si atom by means of a spacer group. Examples of SiH groups and spacer moieties which may be bound to cage Si atoms include, but are not limited, to —O—$SiR_2$H, —O—$R^1$—$SiR_2$H, —$R^1$—$(SiR_2O)_2$H, and the like. When siloxane-linked SiH groups are present, it is preferable that the spacer contain no more than 4 diorganosiloxy groups, preferably on average less than 3 diorganosiloxy groups, and most preferably, 1 or 2 diorganosiloxy groups. In the formulae above, R is an organo group, preferably an alkyl, cycloalkyl, aryl, alkaryl, or aralkyl group, preferably a methyl group, and $R^1$ is a divalent hydrocarbon group other than a vinyl group or phenyl group, preferably an alkyl or cycloalkyl group.

The reactive functional group may be a condensable group such as silanol, alkoxy, acetoxy, silazane, oximino-functional silyl group, or other groups which react and generate a molecular byproduct species. Condensable functional groups are not preferred unless polymerization can be conducted in vacuo, or when the byproduct molecules diffuse from the polymer or are present in such small domains that light scattering at the wavelengths of interest is minimal. Silanol, alkoxy, and acetoxy groups are all capable of condensing with Si—H groups. During the condensation, the byproducts, respectively, are molecular hydrogen, alkanol, and acetic acid.

The spacer moieties may be any which allow for some steric repositioning of the reactive functionalities such that a relatively high degree of reaction is possible. The most preferred spacer moieties include diorganosiloxy ($OSiR_2$) and hydrocarbon diradical spacers, although other spacer moieties such as alkoxy, polyoxyalkylene, ester and the like may also be employed. Phenyl groups and other aromatic groups are also useful spacer moieties, especially when other more "flexible" moieties such as aliphatic hydrocarbon diradicals or dialkylsiloxy diradicals are also present, either on the same or on a different molecule.

Two or more different functionalized polyhedral silsesquioxanes may be polymerized, or a single type of polyhedral silsesquioxanes may be polymerized. It is particularly preferred that a single type of polyhedral silsesquioxane be polymerized, for example "incompletely functionalized" silsesquioxanes, or complementarily reactive silsesquioxanes.

By "incompletely functionalized" is meant that a polyhedral silsesquioxane is modified to contain a specific functional group or type of functional group different from the group or groups present in the initial polyhedral silsesquioxane, or is synthesized from monomers, which synthesis results in having one type of functional group present on between 20 mol percent and 80 mol percent, on average, of the cage Si atoms. For example, a convenient starting material for synthesis of the monomers of the present invention is octakis[hydrido]silsesquioxane, $H_8Si_8O_{12}$ ("OHS"). By itself, even in admixture with other polyhedral silsesquioxanes containing spacer-linked complementarily reactive molecules such as alkenylsiloxy groups, OHS is not a particularly good monomer. The ability of all eight of the Si—H bound hydrogens to react is limited as reaction proceeds due to the decreased mobility of the silsesquioxane cage and the steric unavailability of Si—H/akenyl reaction sites which results. However, OHS may be reacted with from 2 to 6 mols of a dialkenyl-functional silane such as allyldimethylcyclohexenylsilane in a hydrosilylation reaction to prepare incompletely functionalized polyhedral silsesquioxanes containing both SiH groups and 1-propyl-(cyclohexenyl)dimethylsilyl groups. Preferably, about 4 mols of hydrosilylating reactant is used, thus preparing polyhedral silsesquioxanes having on average about 4 of each type of complementarily reactive groups.

Preferred reactive polyhedral silsesquioxanes have all reactive functional groups bonded to cage Si atoms via spacer moieties, and most preferred polyhedral silsesquioxanes of this type also contain at least two types of reactive functionality, or a mixture of one or more reactive functionalities and also non-reactive groups such as methyl groups or trimethylsiloxy groups. Such preferred reactive polyhedral silsesquioxanes can be readily prepared from the octaanion $Si_8O^{8-}_{12}$ by reaction with a suitably functionalized chlorodiorganosilane such as chlorohydridodimethylsilane (to provide spacer-linked Si—H functionality) or chlorocycloalkenyldimethylsilane (to provide spacer-linked cycloalkenyl functionality). Actually, both of these reactive moieties may be reacted simultaneously or sequentially to provide polyhedral silsesquioxanes containing both SiH and cycloalkenyl spacer-linked functionalities. The ratio of functionalities may be easily adjusted, and polymers may be prepared, in this case by hydrosilylation in the presence of a hydrosilylation catalyst, from a single monomer, for example tetrakis[hydridodimethylsiloxy]-tetrakis[(cycloalkenyl)dimethylsiloxy]silsesquioxane, or from mixtures of differently functionlized silsesquioxanes, for example hexakis[hydridodimethylsiloxy]-bis[(cyclohexenyl)dimethylsiloxy]silsesquioxane and bis[hydridodimethylsiloxy]-hexakis[(cyclohexenyl)dimethylsiloxy]silsesquioxane. While in general, equimolar ratios of complementarily reactive functional groups is desired, with any particular monomer system, ratios other than equimolar, for example 1:2 to 2:1, preferably 2:3 to 3:2 may be preferable. The optimal ratio is easily determined by a series of polymerizations at different ratios, and selecting the ratio which provides the best property or combinations of properties under consideration, e.g. ease of processability, color, transparency, hardness, tensile strength, etc.

The length of the spacer moiety may be considered as the number of intervening atoms of all types in a continuous chain between the cage Si atom and the reactive functional group. In a dimethylsiloxy group containing a 3-cyclohexenyl reactive functional group, for example, the number of intervening atoms between the cage Si atom and the site of ethylenic unsaturation is 7 atoms (1 O, 1 Si, 5 C). The spacer moiety is preferably less than 10 atoms in length, more preferably less than 8 atoms in length. The spacer is too long on average when the polymer products begin to become rubbery or elastomeric rather than rigid solids.

It is particularly surprising that spacer linked alkenyl or cycloalkenyl functional groups may be prepared by reacting an SiH functional polyhedral silsesquioxane (hydrogen bonded to cage Si) or a hydridosiloxy-substituted polyhedral silsesquioxane such as octakis[hydridodimethylsiloxy]silsesquioxane with a bis[alkenyl] molecule such as allylcyclohexenyldimethylsilane, vinylcyclohexene, cyclohexadiene, cyclopentadiene, norbornadiene, and the like. In such cases, the principle product is the corresponding alkylene-linked ethylenically unsaturated group. Dimer molecules containing alkylene-linked silsesquioxane cages are present in only small quantities, if at all, and can be removed readily. In particular with conjugated systems such as cyclohexadiene, cyclopentadiene, 1,3-hexadiene and the like, monoaddition products still containing a reactive unsaturation site are the predominant product.

Examples of multi-unsaturated molecules which can react with Si—H functional polyhedral silsesquioxanes include the dienes mentioned previously, as well a furan, pyrrole, thiophene, thiophene-1,1-dioxide, dicyclopentadiene, vinylallyl ether, 5-hexenyallylether, divinylether, divinylbenzene, and the like. Also suitable are unsaturated alkanol esters such as hexanedioldiacrylate, glycerol diacrylate, and the like. Multifunctional unsaturated molecules such as glycerol triacrylate and trimethylolpropane triacrylate may be used when the total of unsaturated functionality is desired to be higher than can be obtained from compounds containing two sites of ethylenic unsaturation.

In preparing polymers from the functionalized polyhedral silsesquioxanes of the present invention, it is desirable, in general, to prepare transparent products. It is also desirable to provide monomers which have a long storage life prior to use, for example one month at 25° C. and preferably two months or longer. It has been surprisingly and unexpectedly discovered that both these goals are facilitated by purifying the sample by precipitation in an incompatible solvent, and preferably by washing the filtrate in further incompatible solvent. By "incompatible solvent" is meant a solvent in which the product is insoluble or sparingly soluble, e.g. a solvent, which when added to a solution of the product in a first solvent, will cause the product to precipitate. An example of a suitable "compatible" solvent is toluene, while examples of suitable "incompatible" solvents include methanol, ethanol, and acetonitrile when alkenylsiloxy- and hydridosiloxy-functional polyhedral silsesquioxanes are involved. Since the hydrosilylation catalyst used to prepare such products has already been deactivated following hydrosilylation, further purification would not be expected to have any effect. However, the storage life is unexpectedly highly prolonged.

This step of precipitating from solvent or solvent mixture(s) can be repeated two or more times, if desired. The same solvent or solvent mixture may be used, or alternatively may be changed. Furthermore, the wash solvent or solvent mixture may be the same as the solvent or solvent mixture from which the product is precipitated, or may be a different solvent or solvent mixture. Preferred solvents and solvent mixtures are or include a solvent selected from alcohols, nitrites such as acetonitrile, ethers such as diethylether, sulfoxides such as dimethylsulfoxide, and amides such as dimethylformamide and dimethylacetamide.

Even more surprising is that the purified monomers more readily form transparent polymer products. Since unpurified monomer solutions are clear and generally colorless also, indicating no oligomeric or polymeric species capable of scattering light, the polymers produced therefrom are sometimes cloudy or translucent rather than transparent. It was highly surprising that purification of the starting monomer would lead to more highly transparent products in general.

It has also been surprisingly discovered that synthesis of polyhedral silsesquioxane monomers via hydrosilylation reactions can be facilitated by solid (heterogenous) hydrosilylation catalysts to prepare monomers which in turn provide polymers with superior properties. The heterogenous catalyst may be any solid hydrosilylation catalyst which is substantially insoluble under the reaction conditions, and include metals such as Pt, Pd, Rh, either in particulate form or on supports such as alumina or silica. Other insoluble metal compounds and complexes are suitable as well, for example $PtO_2$, which is preferred. $PtO_2$ may be used in particulate form or may be formed on a support. Following the hydrosilylation, the solid catalyst is removed by conventional methods such as distillation of the product monomer or by decantation, centrifugation, or filtration of the solid catalyst from the product, preferably filtration. The relatively expensive catalyst is thus more susceptible to recycle and/or reuse. Most surprisingly, monomers prepared by such techniques exhibit superior properties as compared to monomers prepared using soluble hydrosilylation catalysts, including lower coefficients of thermal expansion and in some cases improved transparency.

Numerous synthetic techniques can be employed to produce the monomers of the present invention, and other methods will be apparent to the skilled organic chemist. The two preferred methods are reaction of halosilanes with polyhedral silsesquioxane anions, and hydrosilylation of Si—H functional polyhedral silsesquioxanes as previously disclosed. The products of these reactions can be used as intermediates in the synthesis of the other monomers as well. For example, octakis[hydridodimethylsiloxy]silsesquioxane can be easily synthesized by reacting chlorodimethylsilane with the octaanion of $Si_8O_{12}$. The resulting product can be further functionalized by reacting the Si—H functionality obtained in the latter reaction with an unsaturated molecule such as vinylcyclohexene. If less than an equimolar amount of unsaturated compound is employed, a polyhedral silsesquioxane with both hydridodimethylsiloxy and dimethy[ethylcyclohexenyl]siloxy functionality will be obtained, both linked to the silsesquioxane cage by spacers.

The $Si_8O_{12}$ octaanion and similar anions of other polyhedral silsesquioxanes can also be reacted with reactive halogens such as chlorosilanes and chloroorgano compounds in the presence of base to generate other functionalities. Non-functional groups such as methyl groups and phenyl groups can also be introduced by these methods. The monomers of the subject invention may contain such non-functional groups as well as functional groups. Preferably, less than 70% of cage Si atoms are bonded directly or indirectly to non-functional groups, more preferably about 50% or less, and most preferably, 30% or less, on a mol/mol basis.

It has also been discovered that the monomers of the present invention are capable of sublimation. This is especially surprising in view of the nature of these monomers, which can be considered as having a high inorganic content due to their silsesquioxane cage. The ability to sublime these monomers leads not only to additional possibilities for monomer purification, but also to novel methods of deposition of the monomers onto substrates to prepare polymerization coatings, encapsulants, etc. In the case of syntheses where oligomeric products are present, for example, sublimation at low pressure may be used to separate the monomeric molecules from dimers and oligomers.

In order to form polymers, the monomers or mixtures of monomers are deposited, i.e. by sublimation, from solution, or from the melt, onto a suitable substrate, which may, e.g., be a device to be coated or encapsulated, a surface to be coated, a mold, etc., and where solvent is present, the solvent is evaporated at any convenient pressure. The monomer(s) are then heated for a time sufficient to provide the desired degree of reaction, i.e. polymerization. The polymerizable mixture may contain catalysts to accelerate cure, if desired. If the curing (polymerization) reaction is a hydrosilylation, a hydrosilylation catalyst such as the known platinum hydrosilylation catalysts, may be added. If the reaction is a condensation reaction, condensation catalysts such as tin catalysts, amine catalysts, or the like may be added. Many of the monomers bearing unsaturated reactive functional groups can be polymerized thermally without added catalyst, or only with catalyst residues which may remain in the monomer product from its preparation.

Suitable polymerization temperatures are easily determined by polymerizing at various temperatures for various lengths of time. The temperature and time will, in general, be dependent upon the type of reaction, i.e. addition, hydrosilylation, condensation, etc., as well as the reactivity of the specific monomers. The determination of thermal polymerization parameters may be simplified greatly by DSC and noting the temperature at which polymerization begins by the reactive exotherm. Once a suitable reaction temperature is established by DSC, a series of samples may be polymerized at various lengths of time to determine the minimum polymerization time necessary. In some cases, particularly when active hydrosilylation catalysts are employed without inhibitors or sulfur compounds, respectively, polymerization may take place at room temperature.

Polymerization in the case of addition polymerization may also take place photochemically. Exposure to UV light alone may in some cases be sufficient, or the addition of photocuring catalysts well known in the art, such as the Darocur® and Irgacure® catalysts from Ciba Specialty Chemicals and SartomerO photoinitators from Sartomer Company can be used. Addition polymerization may also be effected using free radical initiator precursors, or from thermal sources such as organic peroxides, hydroperoxides, peroxyesters, peroxyketones, and the like.

Thus, in one aspect, the subject invention pertains to monomers and monomer systems containing a plurality of monomers, these monomers containing as at least a portion of their reactive or complementarily reactive groups, reactive functional species linked to Si atoms of polyhedral silsesquioxanes by means of spacer molecules. Preferably, the monomers contain two complementarily reactive groups on the same molecule, at least one of which, or portions of both of which are bonded to cage Si atoms by spacer moieties. Preferred monomers contain Si-bound hydrogen bonded directly to cage Si atoms and ethylenic or ethylynic sites bonded to cage Si atoms via spacer moieties. When only ethylenic or ethylynic sites are present, either of a single type or of a plurality of types, at least a portion of these must be bonded to cage Si atoms through spacer moieties. Oktakis[hydrido]silsesquioxane and octakis[vinyl]silsesquioxane, containing H and vinyl bound directly to each cage Si atom, are not inventive monomers of the present invention, although these may be used as comonomers in small amounts in the inventive polymers, i.e. preferably less than 30 mol percent, most preferably less than 10 mol percent based on all monomers.

In another aspect, the invention pertains to a process for preparing an organic-inorganic hybrid polymer UV protective material by providing one or more polyhedral silsesquioxane $[SiO_{1.5}]_n$ where n=6, 8, 10, or 12; functionalizing the polyhedral silsesquioxane with a plurality of —$SiMe_2R$ groups wherein at least some of R on average are $R^1$ groups and at least some of R are on average $R^2$ groups where $R^1$ and $R^2$ are R groups reactive with each other, and remaining R groups are non-reactive groups to form polyhedral silsesquioxane macromonomer(s); and curing the polyhedral silsesquioxane macromonomer(s) to produce an organic-inorganic hybrid polymer by reacting reactive R groups on different silsesquioxane macromonomer(s), wherein the organic-inorganic hybrid polymer has at least a 60% transmittance at 215 nm. In this embodiment, the reactive R groups $R^1$ and $R^2$ may be individually selected from silicon-bonded H, halo, $OR^3$ where $R^3$ is H or alkyl, preferably $C_{1-4}$ alkyl, alkenyl, preferably $C_{2-18}$ alkenyl, and more preferably $C_{2-8}$ alkeynl, alkynyl, preferably $C_{2-8}$ alkynyl, and cycloalkenyl, preferably $C_{4-18}$ cycloalkenyl, more preferably $C_{4-12}$ cycloalkenyl, and most preferably $C_{6-10}$ cycloalkenyl, and non-reactive R are preferably selected from the group consisting of alkyl, cycloalkyl, trialkylsilyl, and w-trialkylsilyl-terminated (poly)siloxy, the alkyl groups in non-reactive R groups preferably being methyl groups. The ratio of reactive groups $R^1$ to reactive groups $R^2$ is desirably from 0.25:1 to 1:1.

In yet another aspect, the invention pertains to a process for preparing an organic-inorganic hybrid polymer UV transparent material by functionalizing a polyhedral silsesquioxane with a first functionalizing group to form a first reactive functionalized polyhedral silsesquioxane of the approximate formula $[R^1Me_2SiOSiO_{1.5}]_n$ where n is 6, 8, 10, or 12, or a mixture thereof, and functionalizing a polyhedral silsesquioxane with a second functionalizing group to form a second reactive functionalized polyhedral silsesquioxane of the approximate formula $[R^2Me_2SiOSiO_{1.5}]_n$ where n is 6, 8, 10, or 12, or a mixture thereof, where $R^1$ and $R^2$ are reactive functional groups which react with each other to covalently bond the first reactive functional polyhedral silsesquioxane with the second reactive silsesquioxane, and wherein some of $R^1$ and $R^2$ may be replaced by R groups which are non-reactive with $R^1$ and $R^2$, and curing the reactive functionalized silsesquioxanes. Preferably, the first reactive functionalized polyhedral silsesquioxane bears on average at least 2 $R^1$ groups, more preferably at least 4 $R^1$ groups, and most preferably at least 6 $R^1$ groups and the second reactive functionalized polyhedral silsesquioxane bears on average at least 2 $R^2$ groups, more preferably at least 4 $R^2$ groups, and most preferably at least 6 $R^2$ groups.

Reactive functional groups $R^1$ may comprise two different reactive functional groups $R^{1'}$ and $R^{2''}$, and reactive functional groups $R^2$ may comprise two different reactive functional groups $R^{2'}$ and $R^{2'}$, $R^{1'}$ and $R^{2''}$ reactive with each other and $R^{1''}$ and $R^{2''}$ reactive with each other. The reactive groups may be the same as already disclosed in other embodiments, and need not be repeated. The mol ratio of $R^1$ to $R^2$ is preferably 0.20:1 to 1:1, more preferably 0.25:1 to 1:1, and the mol ratio of $R^{1'}$ to $R^{2''}$ is preferably 0.20:1 to 1:1, more preferably 0.25:1 to 1:1.

Preferred first and said second functionalized silsesquioxanes are prepared by reacting a silsesquioxane of the approximate formula $$[H\text{—}Si(Me)_2\text{—}O\text{—}SiO_{1.5}]_n$$

where n is 6, 8, 10, or 12, or mixtures thereof, with at least one of dimethylvinylmethoxysilane and dimethylvinylethoxysilane.

In yet another aspect, the invention pertains to a process for preparing an organic-inorganic hybrid polymer encapsulating material by providing a polyhedral silsesquioxane; functionalizing the polyhedral silsesquioxane with one or more types of reactive functional groups $R^1$ to provide functional polyhedral silsesquioxane of the formula $$[RMe_2SiOSiO_{1.5}]_n$$

where n is 6, 8, 10, 12, or mixtures thereof, where R is a reactive or non-reactive organic group, with the proviso that at least one R is a reactive functional group $R^1$, to form a macromonomer; adding a crosslinking agent reactive with reactive functional group $R^1$, to form a curable mixture; and curing the curable mixture to form a hybrid organic-inorganic encapsulant having a light transmission at 215 nm of at least 60%, where R and $R^1$ may be as previously disclosed.

In a still further embodiment, the invention pertains to a process for synthesizing a UV transparent organic-inorganic hybrid macromonomer by providing a polyhedral silsesquioxane having reactive sites thereon; reacting at least a portion of the reactive sites with one or more functionalizing reagents to provide a macromonomer of the formula $$[RMe_2SiOSiO_{1.5}]_n$$

wherein n is 6, 8, 10, 12, or mixtures thereof, and R is a non-reactive or reactive group, with the proviso that at least one R is an $R^1$ reactive group and at least one R is an $R^2$ reactive group, where $R^1$ and $R^2$ are interreactive, and wherein all groups R are selected such that said macromonomer has a light transmission of at least 60% at 215 nm, where R, $R^1$, and $R^2$ may be as previously disclosed. In one especially preferred variant of this embodiment, the polyhedral silsesquioxane has the formula $$[HMe_2SiOSiO_{1.5}]_n$$

and functionalizing takes place with one or more functionalizing reagents from among 4-vinyl-1-cyclohexene, dimethylvinylchlorosilane, dimethylvinylmethoxysilane, dimethylvinylethoxysilane, dicyclopentadiene, bis[trimethylsilyl]acetylene, and trimethylsilylacetylene.

Other preferred functionalizing agents may be selected independently from among the following compounds, although this list is illustrative and not limiting: dimethylallylsilane, 1,1,3,3-tetramethyl-1-allyldisiloxane 1,1,3,3-tetramethyl-1-vinyldisiloxane, dimethyloctenylsilane, dimethylsilane, 1,1,3,3-tetramethyl-1,3-disiloxane, 1,1,3,3,5,5-hexamethyltrisiloxane, 1,1,3,3,5,5,7,7-octamethyltetrasiloxane, 1,2-dimethylsilylethane, divinyldimethylsilane, 1,3-diallyltetramethyldisiloxane, 1,3-diallyltetraphenyldisiloxane, 1,1,3,3-tetramethyl-1,3-divinyldisiloxane, 1,2-bis(dimethylsilyl)ethane, dimethylchlorosilane, dimethylmethoxysilane, dimethylethoxysilane, 1,1,3,3-tetramethylvinylchlorosilane, 1,1,3,3-tetramethylvinylmethoxysilane, 1,1,3,3-tetramethylvinylethoxysilane, [(bicycloheptenyl)ethyl]dimethylchlorosilane, [(bicycloheptenyl)ethyl]dimethylmethoxysilane, [(bicycloheptenyl)ethyl]dimethylethoxysilane, allyldimethylchlorosilane, allyldimethylmethoxysilane, allyldimethylethoxysilane, 6-hexenyldimethylchlorosilane, 6-hexenyldimethylmethoxysilane, 6-hexenyldimethylethoxysilane, 10-undecenyldimethylchlorosilane, 10-undecenyldimethylmethoxysilane, 10-undecenyldimethylethoxysilane, [2-(3-cyclohexenyl)ethyl]dimethylchlorosilane, [2-(3-cyclohexenyl)ethyl]dimethylmethoxysilane, [2-(3-cyclohexenyl)ethyl]dimethylethoxysilane, 1,5-dichlorohexamethyltrisiloxane, 1,5-dimethoxyhexamethyltrisiloxane, 1,5-diethoxyhexamethyltrisiloxane, 1,3-dichlorotetramethyldisiloxane, 1,3-dimethoxytetramethyldisiloxane, 1,3-diethoxytetramethyldisiloxane, 1,3-dichlorotetraphenyldisiloxane, 1,3-dimethoxytetraphenyldisiloxane, 1,3-diethoxytetraphenyldisiloxane, diallyldiphenylsilane, 1,4-bis(hydroxydimethylsilyl)benzene, diisopropylchlorosilane, diisopropylmethoxysilane, diisopropylethoxysilane, diisopropyldichlorosilane, diisopropyldimethoxysilane, diisopropyldiethoxysilane, dimesityldichlorosilane, diphenylchlorosilane, diphenylvinylchlorosilane, diphenylvinylmethoxysilane, diphenylvinylethoxysilane, dipehnyldichlorosilane, diphenyldimethoxysilane, diphenyldiethoxysilane, diphenylsilanediol, diphenylsilane, di(p-tolyl)dichlorosilane, di(p-tolyl)dimethoxysilane, di(p-tolyl)diethoxysilane, 1,5-divinyl-1,3-diphenyl-1,3-dimethyldisiloxane, 1,5-divinyl-3-phenylpentamethyltrisiloxane, divinyltetraphenyldisiloxane, methyldichlorosilane, methyldimethoxysilane, methyldiethoxysilane, phenylethyldichlorosilane, phenylethyldimethoxysilane, phenylethyldiethoxysilane, phenylmethyldichlorosilane, phenylmethyldimethoxysilane, phenylmethyldiethoxysilane, phenylmethylsilane, 3-phenyl-1,1,3,5,5-pentamethyltrisiloxane, 1,1,3,3-tetraisopropyl-1,3-dichlorodisiloxane, 1,1,3,3-tetraisopropyl-1,3-dimethoxydisiloxane, 1,1,3,3-tetraisopropyl-1,3-diethoxydisiloxane, 1,1,3,3-tetraisopropyldisiloxane, vinylphenylmethylchlorosilane, vinylphenylmethylmethoxysilane, vinylphenylmethylethoxysilane, vinylphenylmethylsilane, cyclohexadiene, dimethylallychlorosilane, dimethylhexenylchlorosilane, and 5-vinyl-2-norbornene.

The subject invention also pertains to polymers produced by the disclosed processes. In one such embodiment, an organic-inorganic hybrid polymer material comprises a plurality of identical or different covalently bonded polyhedral silsesquioxane macromonomer-derived moieties, of the formula $$[A_{0.5}Me_2SiOSiO_{1.5}]_n [RMe_2SiOSiO_{1.5}]_{n'}$$

where n is a positive whole number, n' is 0 or a positive whole number, and the sum n+n' is 6, 8, 10, or 12, R is a non-reactive organic group or an unreacted reactive functional group $R^1$ or $R^2$, and A is a divalent bridging group linking two polyhedral silsesquioxane moieties and derived from the reaction of two interreactive groups $R^1$ and $R^2$ which are different from each other, each macromonomer possessing, on average, both $R^1$ and $R^2$ groups, wherein the reactive and non-reactive groups R and the bridging group A are selected such that the polymer material has a light transmission of at least 60% at 215 nm.

In a further embodiment, the invention pertains to an organic-inorganic hybrid polymer material comprising a plurality of identical or different covalently bonded polyhedral silsesquioxane macromonomer-derived moieties, of the formula $$[A_{0.5}Me_2SiOSiO_{1.5}]_n [RMe_2SiOSiO_{1.5}]_{n'}$$

where n and n' are as described previously, R is a non-reactive organic group or an unreacted reactive functional group $R^1$ or $R^2$, A is a divalent bridging group linking two polyhedral silsesquioxane moieties and derived from the reaction of two different interreactive groups $R^1$ and $R^2$, each macromonomer bearing at least two $R^1$ or $R^2$ groups, and not bearing both $R^1$ and $R^2$ groups, wherein the reactive and non-reactive groups R and the bridging group A are selected such that the polymer material has a light transmission of at least 60% at 215 nm.

In a still further embodiment, the invention pertains to an organic-inorganic hybrid polymer material comprising a plurality of identical or different covalently bonded polyhedral silsesquioxane macromonomer-derived moieties, of the formula $$[A_{0.5}Me_2SiOSiO_{1.5}]_n [B_{0.5}Me_2SiOSiO_{1.5}]_{n''} [RMe_2SiOSiO_{1.5}]_{n'}$$

where n, and n' are as previously disclosed, and n" is 0 or a positive whole number, and the sum of n, n', and n" is 6, 8, 10, or 12, R is a non-reactive organic group or an unreacted reactive functional group $R^1$, $R^2$, $R^3$, or $R^4$, A is a divalent bridging group linking two polyhedral silsesquioxane moieties and derived from the reaction of two interreactive groups $R^1$ and $R^2$, B is a divalent bridging group linking two polyhedral silsesquioxane moieties and derived from the reaction of two interreactive groups $R^3$ and $R^4$, wherein a first polyhedral silsesquioxane macromonomer bears $R^1$ and $R^3$ groups and a second polyhedral silsesquioxane macromonomer bears $R^2$ and $R^4$ groups, and wherein non-reactive groups R, unreacted groups R, bridging groups A, and bridging groups B are such that said polymer material has a light transmission of at least 60% at 215 mn.

The invention still further pertains to an organic-inorganic hybrid polymer material comprising a plurality of identical or different covalently linked polyhedral silsesquioxane macromonomers, of the formula $$[A_{0.5}Me_2SiOSiO_{1.5}]_n [RMe_2SiOSiO_{1.5}]_{n'}$$

wherein n and n' are as disclosed previously; R is a non-reactive organic group or an unreacted reactive group $R^1$, $R^1$ being the same or different; A is a bridging group linking two polyhedral silsesquioxane moieties, formed from the reaction of two $R^1$, wherein R, $R^1$, and A are such that the polymer material has a light transmission of at least 60% at 215 nm, and to an organic-inorganic polymer material comprising a plurality of identical or different covalently bonded silsesquioxane macromonomer-derived moieties, of the formula $$[A_{0.5}Me_2SiOSiO_{1.5}]_n [RMe_2SiOSiO_{1.5}]_{n'}$$

where n and n' are as described previously; R is a non-reactive organic group or an unreacted reactive functional group $R^1$; $R^1$ are the same or different reactive functional groups which are interreactive with a reactive functional group $R^5$ borne on a crosslinker molecule having at least two $R^5$ groups, $R^5$ being the same or different; A is a divalent linking group derived from the reaction of a reactive $R^1$ group of a polyhedral silsesquioxane macromonomer and a reactive $R^5$ group of a crosslinker molecule; wherein R, R', $R^5$, and A are such that the polymer has a light transmission of at least 60% at 215 nm.

In addition to the monomers of the present invention, the subject invention polymers may also contain up to 50 mol percent, preferably less than 20 mol percent, and most preferably less than 10 mol percent of highly crosslinked, substantially non-cage-like functionalized silicone resins, so long as the optical and physical properties desired of the polymers can be maintained. The polymers may also contain minor amounts of linear or branched organopolysiloxanes which are at least trifunctional, and preferably have a higher functionality. Examples include Si—H functional poly(dimethylsiloxy)(methylhydridosiloxy) oligomers and polymers. The latter are present in an amount such that the final product is not elastomeric or rubbery, generally in amounts of less than 20 mol percent, more preferably less than 10 mol percent. The compositions are most preferably free of such species.

Difunctional organopolysiloxanes or oligomers such as α,ω-Si(CH$_3$)$_2$-terminated siloxanes or α, ω-divinyl-terminated siloxanes may be added in most minor amount, for example less than 10 mol percent, more preferably less than 5 mol percent, so long as hard, rigid polymers and not rubbery elastomers are obtained. Likewise, polyalkenyl compounds such as 1,5-hexadiene and isoprene may be used as well, with the same limitations. Other higher functional monomers such as trimethylolpropane triacrylates, glycerol triacrylates, trivinylbenzene, trivinylcyclohexane, etc., can also be used. In general, the higher the functionality of these non-subject invention monomers, the higher the amount which can be tolerated. Preferably, added monomers will not provide chemical groupings which absorb light at the wavelengths of interest. Liquid and low melting monomers can be employed to reduce the viscosity of the polymerizable mixture, as well as, in some cases, to increase the compatibility of oligomerization and polymerization products with the non-polymerized or lesser polymerized portions of the matrix. If the solubility of the polymerized products at the polymerization temperature is low in the polymerizable mixture, a phase out of polymer and/or oligomer particles may occur which will produce haze or opaque materials as opposed to transparent materials.

The novel monomers of the subject invention are preferably polyhedral silsesquioxanes with complementarily reactive functional groups on each molecule. Preferred complementarily functional groups are Si-bound hydrogen and ethylenic or ethylynic unsaturation, and Si-bound hydrogen and silicon-bound alkoxy groups. The novel monomers correspond to the general formula

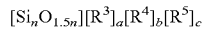

$$[Si_nO_{1.5n}][R^3]_a[R^4]_b[R^5]_c$$

where b and c are 1 or more and at least one of b or c is >2, a+b+c=n, and n is an integer from 6 to 12, and most preferably, 8. The [Si$_n$O$_{1.5n}$] unit is a polyhedral silsesquioxane. R$^3$ is a non-functional group, preferably a C$_{1-18}$ hydrocarbon group, more preferably a C$_{1-4}$ alkyl group or C$_{6-10}$ aryl group, most preferably a methyl group; R$^4$ is H, -L-SiR$^3_2$H, or -L-SiR$^3$H$_2$ where R$^3$ is a non-functional hydrocarbon such as R$^3$ and L is a divalent, non-reactive spacer moiety which may be a C$_2$-C$_{18}$ hydrocarbon, preferably C$_{2-8}$ alkylene, C$_{5-8}$ cycloalkylene, or C$_{7-10}$ alkarylene, a siloxy group —SiR$^3_2$—O— or a polysiloxy group $\text{-}[SiR^3_2O]_m\text{-}$ where m is an integer from 2-10, preferably 2-4; and R$^5$ is an alkenyl-functional group other than a vinyl group, preferably a C$_{3-18}$ ethylenically or ethylynically unsaturated hydrocarbon which is not connected to an Si atom of the polyhedral silsesquioxane at an unsaturated carbon atom, preferably an alkenyl or cycloalkenyl group, or a group $\text{-}[SiR^3_2O]_o\text{-}[SiR^3_2]_p\text{-}Y$ where o is an integer from 0 to 4 and p is 0 or 1, wherein o and p may not both be 0, and wherein Y is an ethylenically or ethylynically unsaturated group. R$^5$ may also, in lieu of an unsaturated group, bear an alkoxysilyl group such as dimethylmethoxysiloxy, etc., in other words, groups which bear a reactive silicon-bonded alkoxy group, preferably a C$_{1-4}$ alkoxy group. A plurality of alkoxy groups may also be present.

Preferred monomers are those where a is 0, 1, or 2, preferably 0, and both b and c on average are between 2 and 6, more preferably between 3 and 5, and the sum of b+c is on average 8. In the preferred monomers, R$^4$ is -L-SiR$^3_2$H or -L-SiR$^3$H$_2$, and the preferred groups R$^5$ are ethylenically unsaturated aliphatic and cycloaliphatic hydrocarbons having 4 to 10 carbon atoms. Cycloaliphatic in this sense includes cycloaliphatic compounds attached to silicon via an alkylene group, such as those derived from vinylcyclohexene. Further preferred R$^5$ are those of the formula —SiR$^3_2$—Y where Y is alkenyl, alkynyl, or cycloalkenyl.

A preferred synthesis of the subject invention compementarily reactive monomers is the partial hydrosilylation of a polyhedral silsesquioxane bearing predominantly, and preferably wholly, cage silicon-bonded —SiR$^3_2$H moieties. Hydrosilylation is preferably conducted in a suitable, preferably apolar organic solvent such as a paraffinic hydrocarbon such as hexane, or preferably, an aromatic solvent such as toluene or xylene (single isomer or mixture). Other solvents such as tetrahydrofuran, diethyl ether, dimethylformamide, dimethylacetamide, dimethylsulfoxide, etc., may also be used so long as the starting materials are soluble or become solubilized during the reaction.

As the hydrosilylation catalyst, compounds of Pt, Pd, Rh, and other noble metals generally used as hydrosilylation catalysts may be used, including platinum olefin complexes commonly known as Karstedt catalysts. The noble metals themselves may be used as well. Preferred hydrosilylation catalysts are those employed in the examples, particularly Pt (divinylsiloxane) complexes, Pt (dicyclopentadiene) complexes, and most preferably, metallic Pt and PtO$_2$.

Supported catalysts and solid catalysts are particularly suitable, as these can be removed from the reaction mixture for recycle or reuse, and catalyst deactivation need not occur. It has been surprisingly and unexpectedly discovered, for example, that TCHS prepared using the solid catalyst PtO$_2$ which is subsequently removed by filtration, can be polymerized to a transparent polymer which has a lower coefficient of thermal expansion than TCHS of similar composition prepared employing a soluble catalyst which is subsequently deactivated.

The amount of hydrosilylation catalyst is typical for the use of these catalysts, and may vary from 0.01 ppm based on the weight of the starting polyhedral silsesquioxane with Si—H functionality, to 1000 ppm, preferably 0.01 ppm to 200 ppm, more preferably 0.01 to 50 ppm, and most preferably 0.02 to 2 pm. Where heterogenous (solid or supported) catalysts are employed, somewhat larger amounts are employed in order to keep the reaction time reasonable. For 100 g octakis[hydridodimethylsiloxy]silsesquioxane, from 0.05 to 0.2 g of PtO$_2$ has been found to work satisfactorily.

When soluble catalysts are employed, and the product is not to be immediately used, the catalyst must generally be deactivated to provide an adequate shelf life of the monomer product, since the product itself contains both Si—H and ethylenic unsaturation which can react with each other via hydrosilylation. Conventional means of catalyst deactivation may be used, including addition of phosphines such as triphenyl phosphine, addition of sulfur compounds such as mercaptans, and any method generally known in the art. Catalyst deactivation may not be necessary if the hydrosilylation catalyst used is only effective at relatively high temperatures. Also, alkynol inhibitors and other inhibitors known to those skilled in the art of hydrosilylation can be used as well. Such inhibitors are generally effective at relatively low temperatures, e.g. room temperature and slightly elevated temperatures, but are unable to inhibit the catalyst at higher temperatures. When the platinum catalyst is to be deactivated, triphenylphosphine is preferably used in an amount of less than 0.09 weight percent relative to the weight of the complementarily reactive monomer. Other deactivators may be used as well, however, including arsines, stibines, alkali cyanides, etc.

TCHS will cure above 80° C. to a rigid body with less than 0.09 mol % deactivation agent relative to TCHS, although the hybrid does not fully cure even at 200° C. overnight with more than 0.2 mol % deactivation agent relative to TCHS. Less than 0.09 mol % of deactivating agent is preferred when triphenylphosphine is added. Amounts used for other deactivators will vary with the type and the curing conditions desired. Based on these results, the amount of deactivation agent serves an important role to prepare fully cured materials. In addition, the deactivator also will control the temperature required or the time required to fully cure these materials. Likewise, it will affect the rate of cure in the presence or absence of oxygen.

Alternative methods which can be used to synthesize the novel monomers of the subject invention are disclosed in U.S. Pat. No. 5,047,492, herein incorporated by reference. However, the reaction sequences and raw materials must be changed in order to prepare polyhedral silsesquioxanes, and the polyhedral silsesquioxanes must be synthesized to contain complementarily reactive spacer-linked functional groups.

The novel polymers of the present invention comprise polymers prepared from polyhedral silsesquioxane monomers bearing spacer-linked unsaturated groups, optionally in conjunction with silicone resins or silicone oligomers or polymers containing in excess of three corresponding or complementarily reactive groups and preferably no more than 5 mol percent of difunctional silicone oligomers or polymers, preferably exclusively or substantially all polyhedral silsesquioxanes containing spacer-linked ethylenically unsaturated groups; or may contain the novel monomers of the subject invention bearing complementarily reactive groups, at least one of which is spacer-linked to the silicon atoms of the polyhedral silsesquioxane, optionally with further silicone oligomers or polymers or other molecules bearing at least two and preferably three or more of a corresponding functional group (i.e. of the same type as one of the complementarily reactive groups) or a complementarily reactive group (i.e. of a different type, but reactive with at least one type of reactive group on the polyhedral silsesquioxane). Preferably, the polymers are prepared exclusively from polyhedral silsesquioxanes of the same type, although the proportion of complementarily reactive groups may differ. In either case, the proportion of low functionality polymers, i.e. those with a low "density" of functional groups per molecule, will be such that the product is a solid, and not a rubbery elastomer.

The invention will now be described in terms of the following examples, which are not to be interpreted as limiting the invention in any way. Unless indicated otherwise, all synthesis are performed at room temperature or a temperature reached following mixing of the reactants, at the pressure of the surrounding atmosphere.

EXAMPLES

Example 1

Figure 3:
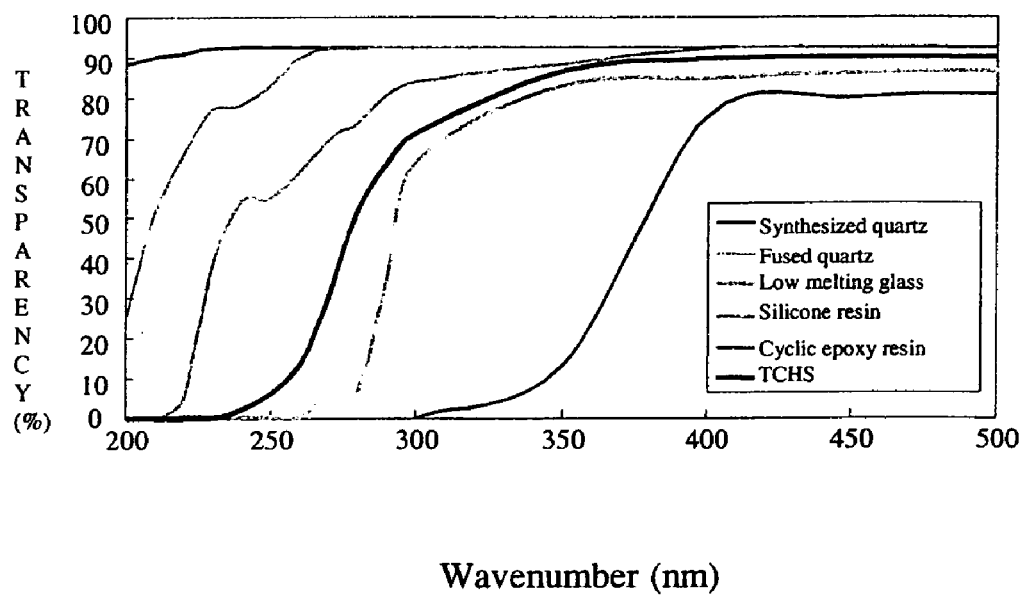
FIG. 3 illustrates the UV transmission spectrum of several materials, including a preferred polymer of the subject invention.

FIG. 3 compares the transparency of bulk synthetic quartz (blue), fused quartz (pink), KE-106, Shinetsu silicone resin (light blue, no aromatic components), low melting glass (red), transparent epoxy resin (purple) and TCHS (green-blue curve).

From FIG. 3, the transparency of TCHS (green-blue) is much better than the epoxy resin (purple) used as an organic transparent encapsulate material for current infrared LEDs and offers almost the same transparency as silicone resin (light blue) and low melting glass (red). However, unlike silicone resins, this material offers more robust mechanical properties. The FIG. 3 data indicate that the TCHS hybrid nanocomposite has excellent potential for transparent coatings and films, especially those which must be transparent to UV light. Furthermore, TCHS cures at relatively low temperatures (150-200° C.), and is air stable to 400° C., a property often not found with silicone resins.

Transparency herein means ≧60% transmittance at ≧215 nm, preferably >70% and most preferably >85%. Preferably, the minimum wavelength of transmitted light is <380 nm and most prefereably <300 nm. Cured TCHS materials satisfy all of these requirements.

Example 2

Tetrakis(cyclohexenylethyldimethylsiloxy)tetrakis (dimethyl-siloxy)silsesquioxane, TCHS

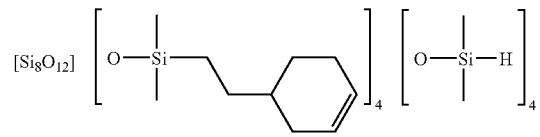

To a 250 ml Schlenk flask equipped with reflux condenser, is added octakis [hydridodimethylsiloxy] silsesquioxane "OHSS" (20 g, 20 mmol). The flask is heated under vacuum to eliminate residual air and moisture and then flushed with nitrogen. Toluene (50 ml), 5-vinyl-1-cyclohexene (8.7 g, 80 mmol), and 2 mM Pt(dcp)-toluene solution (1 ml, Pt: 2 ppm) as a catalyst are then added to the flask.

The mixture is stirred at 90° C. for 5 h. Then triphenylphosphine [5 mg 0.45 mol %)] is added to deactivate the catalyst and solvent removed to provide a white powder product. The yield is 27.5 g (0.019 mol) 94%. The powder is TCHS.

Analytical Data

DTA-TGA: $Tg_5$: 367° C. (in air), Ceramic yield: 66.9% (1000° C. in air, Calcd.: 65.2%)

DSC: Mp: 76.3° C., Curing temperature: 180° C.

$^1$H NMR: Si—$CH_3$, 0.15 ppm, 26 H, s

H—$SiCH_3$, 0.26 ppm, 23 H, s

Si—$CH_2$, 0.65 ppm, 9.4 H, d

Cyclohexenyl, 1.1-2.1 ppm, 42 H, m

Si—H, 4.74 ppm, 4 H, s

C=C—H, 5.66 ppm, 8.8 H, s $^{13}$C NMR: Si—$CH_3$, 0.18 ppm, s

H—Si—$CH_3$, 0.73 ppm, s

Si—$CH_2$, 15.3 ppm, s

Cyclohexenyl, 29.1, 30.2, 32.2, 37.0 ppm, s

C=C, 127.5 ppm, d

FTIR: ν C—H, 3020 $cm^{-1}$

ν Si—H, 2200 $cm^{-1}$

ν Si—O—Si, 1095 $cm^{-1}$

Based on the $^1$H NMR spectrum and TGA-DTA data, the average structure of TCHS is determined to be as shown below.

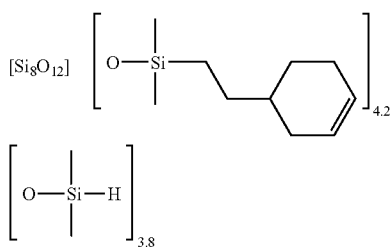

Example 3

Synthesis of Tetrakis(cyclohexenylethyldimethylsiloxy)tetrakis(dimethylsiloxy)octa-silsesquioxane (TCHS) with purification

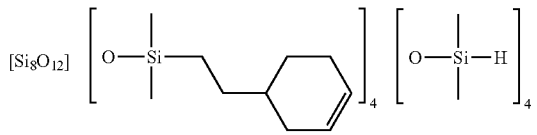

The synthesis procedure of Example 2 is followed except for the addition of deactivation agent. Purification is accomplished on a smaller scale (OHSS: 10 g, 10 mmol) by adding a TCHS toluene solution dropwise to a solvent such as methanol and acetonitrile (400 ml) to obtain white TCHS powder. This powder is filtered off then washed with solvent (50 ml) in a beaker and filtered to give a white powder. This procedure is repeated three times. The white powder is dried in vacuum. The yield of purified TCHS is 3.5 g (2.4 mmol, 24.5%)

Note the shelf life of the sample is prolonged. Although the shelf life of the unpurified sample without deactivation agent is 2 weeks, the shelf life of purified sample (no matter which purification solvent) is 2 months.

Analytical Data $^1$H NMR: Si—CH$_3$, 0.15 ppm, 28 H, s

H—SiCH$_3$, 0.26 ppm, 20 H, s

Si—CH$_2$, 0.65 ppm, 10 H, d

Cyclohexenyl, 1.1-2.1 ppm, 49 H, m

Si—H, 4.74 ppm, 3.2 H, s

C=C—H, 5.66 ppm, 9.4 H, s

From the $^1$H NMR spectrum, the integration ratio between cyclohexene and Si—H is 4.7 to 3.3, representing the average structure below. Compared with the 1H NMR spectrum of the unpurified sample described above, the ratio is changed from 4.2/3.8 (cyclohexene/Si—H). This suggests that the component with lower degrees of substitution is removed from the system.

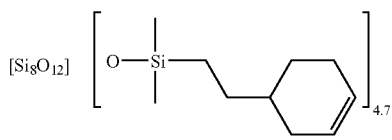

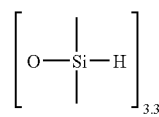

OHSS and its Q$_6$, Q$_{10}$, and Q$_{12}$ analogs can also be synthesized by reaction of the corresponding anions with organochlorosilanes such as dimethylchlorosilane, and unsaturated compounds such as octakis[vinyl]silsesquioxane can be prepared by reaction with dimethylvinylchlorosilane. The latter can be hydrosilylated to produce spacer-linked silsesquioxanes, for example by reaction with dimethylsilane or cyclohexeryl dimethylchlorosilane.

Example 4

Synthesis of Bis(cyclohexenylethyldimethylsiloxy)-hexakis(dimethylsiloxy)-silsesquioxane, BCHS.

To a 100 ml Schlenk flask equipped with reflux condenser, is added octahydridosilsesquioxane OHS (2.5 g, 2.5 mmol). The flask is heated under vacuum to eliminate residual air and moisture, and then flushed with nitrogen. Toluene (20 ml), 5-vinyl-1-cyclohexene (0.26 g, 5 mmol), and 2 mM Pt(dcp)-toluene solution (0.1 ml, Pt: 0.2 ppm) as a catalyst are then added to the flask.

The mixture is stirred at 90° C. for 5 h. After reaction, solvent is removed to obtain white powder. The powder is rinsed with methanol to purify and dry to provide a white powder. The yield is 2.33 g (1.9 mmol) 76%.

Analytical Data

DTA-TGA: Tg$_5$: 452° C., Ceramic yield: 75.8% (1000° C. in air, Calcd.: 79.9%). Note that the TGA in nitrogen also shows that some weight is also lost as some of the complex sublimes.

DSC: Mp: 82° C., Curing temperature: 102, 167° C.

$^1$H NMR: Si—CH$_3$, 0.15 ppm, 11 H, s

H—SiCH$_3$, 0.26 ppm, 37 H, d

Si—CH$_2$, 0.65 ppm, 4 H, d

Cyclohexenyl, 1.1-2.1 ppm, 18 H, m

Si—H, 4.74 ppm, 6 H, s

C=C—H, 5.66 ppm, 3 H, s $^{13}$C NMR: Si—CH$_3$, 0.15 ppm, s

H—Si—CH$_3$, 0.70 ppm. s

Si—CH$_2$, 15.2 ppm. s

Cyclohexenyl, 29.1, 30.2, 32.2, 37.0 ppm. s

C=C, 127.5 ppm, d

FTIR: ν C—H, 3020 cm$^{-1}$

ν Si—H, 2200 cm$^{-1}$

ν Si—O—Si, 1095 cm$^{-1}$

Based on the $^1$H NMR spectrum and TGA-DTA data, the structure of BCHS is determined to be as shown below.

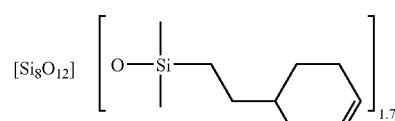

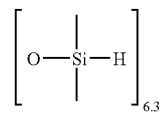

Example 5

Synthesis of Octakis(cyclohexenylethyldimethylsiloxy)silsesquioxane, OCHS

To a 250 ml Schlenk flask equipped with reflux condenser, is added octahydridosilsesquioxane OHS (21.4 g, 21 mmol). The flask is heated under vacuum to eliminate residual air and moisture and then flushed with nitrogen. 5-vinyl-1-cyclohexene (18.2 g, 170 mmol), and 2 mM Pt(dcp)-toluene solution (0.1 ml, Pt: 0.02 ppm) as a catalyst are then added to the flask.

The mixture is stirred at 90° C. for 4 h. After reaction, solvent is removed to obtain a white powder. The powder is rinsed with methanol to purify and then dried, providing a white powder. The yield is 38.5 g (20 mmol) 97%.

Analytical Data

DTA-TGA: $Tg_5$: 348° C., Ceramic yield: 46.8% (1000° C. in air, Calcd.: 51.0%). Note that in nitrogen the ceramic yield is only 36 st. % indicating that some material sublimes at one atmosphere. It also indicates that this material can be used for sublimation (CVD) coatings if desired.

DSC: Mp: 73° C.

$^1$H NMR: Si—$CH_3$, 0.14 ppm, 48 H, s

Si—$CH_2$, 0.65 ppm, 17 H, d

Cyclohexenyl, 1.1-2.1 ppm, 77 H, m

C=C—H, 5.67 ppm, 16H, s $^{13}$C NMR: Si—$CH_3$, −0.20 ppm, s

Si—$CH_2$, 14.8 ppm, s

Cyclohexenyl, 25.6, 28.7, 29.8, 31.8, 36.6 ppm, s

C=C, 127.0 ppm, d

FTIR: ν C—H, 3020 $cm^{-1}$

ν Si—O—Si, 1095 $cm^{-1}$

Based on the $^1$H NMR spectrum and TGA-DTA data, the structure of OCHS is determined to be as shown above.

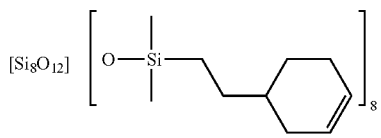

Example 6

Curing TCHS

TCHS (≈1 g) is added to a 10 ml Teflon [23.3×18.3 mm ID] or aluminum cup (25.2×39.6 mm ID). The cup is placed in a vacuum oven thermostatted at 85° C. Following degassing for 2 h at 85° C., the oven is flushed with nitrogen. The temperature is then raised at 30° C./h to 200° C. and kept there for 10 to 24 h overnight providing a transparent disk with thickness of 2.0-4.0 mm.

When a deactivation agent is added as in Example 2, the mixture cures only with difficultly, giving a rubbery material. When the amount of deactivating agent is ≧0.09 mol % (molar ratio of agent to TCHS), an incompletely cured, rubbery and hazy disk is obtained. When less than 0.09 mol % agent is used a completely cured product is obtained as a rigid and transparent disk.

Analytical Data

DTA-TGA: $Tg_5$: 317° C.; Ceramic yield: 67.1% (1000° C. in air, calcd.: 65.2%)

FTIR: n Si—H, 2140 $cm^{-1}$

δ =C—H, 1408 $cm^{-1}$

ν Si—O—Si, 1088 $cm^{-1}$

TMA:

142 ppm (50-100° C.): For a resin prepared from unpurified TCHS 160 ppm (50-100° C.): For a resin prepared from TCHS purified with methanol 133 ppm (50-100° C.): For a resin prepared from TCHS purified with acetonitrile Note that the TMA data shows the effect of the purification procedure. The CTE (coefficient of thermal expansion) of resin prepared from TCHS purified with acetonitrile is smaller than unpurified TCHS or TCHS purified with methanol. This suggests purification with acetonitrile is better to improve properties of resin if low CTEs are desirable.

From the FT-IR, the intensity of the remaining Si—H peak is affected by the addition of deactivation agent. For instance, although the intensity ratio of Si—H (2140 $cm^{-1}$) to Si—O—Si (1088 $cm^{-1}$) of resin from TCHS with 5 mg (0.45 mol %) deactivation agent is 0.11 (intensity ratio of Si—H/Si—O—Si of original TCHS is 0.32); the ratio of resin from TCHS without deactivator is 0.06 when these resins are prepared under identical conditions (air heating to 200° C./24 h). This data suggests that the curing TCHS without deactivator goes further to completion than with deactivator.

Example 7

Curing BCHS

BCHS (≈1 g) is added to a 10 ml Teflon [23.3×18.3 mm ID] or aluminum cup (25.2×39.6 mm ID). The cup is placed in a vacuum oven thermostatted at 85° C. Following degassing for 2 h at 85° C., the oven is flushed with nitrogen. The temperature is then raised at 30° C./h to 200° C. and kept there for 10 to 24 h overnight providing a white powder. BCHS is not cured completely because of a lack of functional groups to crosslink. Therefore, it does not provide a homogeneous resin.

Example 8

Attempt to cure OCHS

OCHS (≈1 g) is added to a 10 ml Teflon [23.3×18.3 mm ID] or aluminum cup (25.2×39.6 mm ID). The cup is placed in a vacuum oven thermostatted at 85° C. Following degassing for 2 h at 85° C., the oven is flushed with nitrogen. The temperature is then raised at 30° C./h to 200° C. and there for 10 to 24 h overnight providing a white powder. OCHS melts but does not cure by thermal polymerization of vinyl groups.

Example 9

Curing OCHS/OHSS

OCHS (1 g, 0.5 mmol)/OHSS (0.5 g, 0.5 mmol) are added to a 10 ml Teflon [23.3×18.3 mm ID] or aluminum cup (25.2× 39.6 mm ID). The cup is placed in a vacuum oven thermostatted at 85° C. Following degassing for 2 h at 85 ° C., the oven is flushed with nitrogen. The temperature is then raised at 30° C./h to 200° C. and held there for 10 to 24 h providing a white opaque disk.

Example 10

Curing OCHS/BCHS

OCHS (0.08 g, 0.04 mmol)/BCHS (0.1 g, 0.08 mmol) are added to a 10 ml Teflon [23.3×18.3 mm ID] or aluminum cup (25.2×39.6 mm ID). The cup is placed in a vacuum oven thermostatted at 85° C. Following degassing for 2 h at 85° C., the oven is flushed with nitrogen. The temperature is then raised at 30 ° C./h to 200° C. and left there for 10 to 24 h providing a white opaque disk.

From examples 6-10, a 0.25 to 1 molar ratio of functional moiety on functionalized polyhedral silsesquioxane to Si—H functionality is preferred, most preferably 0.5 such as in TCHS described above. Because the degree of substitution affects the physical properties of the compound including solubility, melting point, etc., mixtures of compounds with different numbers of substituents like OCHS/BCHS are not always miscible, so that homogeneous and transparent resins do not always form. In addition, a large excess of one reactive group will lead to incomplete curing and inhomogeneities that also will reduce transparencies.

Example 11

Octakis(dicyclopentadienyldimethylsiloxy)octasilsesquioxane (ODCPDS)

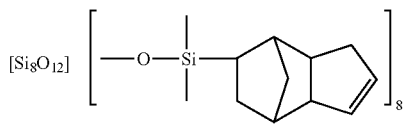

To a 100 ml Schlenk flask equipped with reflux condenser, is added OHSS (5.1 g, 5 mmol). The apparatus is then gently heated in vacuum to remove residual air and moisture and then flushed with nitrogen. Then dicyclopentadiene [10.6 g or 13.2 g (80 mmol or 100 mmol, respectively)] and 2 mM Pt(dvs)-toluene solution (0.1 ml, Pt: 0.2 ppm) as a catalyst, are added to the flask.

The mixture is stirred at 90° C. for 15 h under nitrogen. Although initially opaque, the solution becomes homogeneous after 10 min. The yield is quantitative.

Analytical Data
$^1$H NMR: Si—CH$_3$, 0.098 ppm, 32 H, d
HSi—CH$_3$, 0.27 ppm, 16 H, s
Si—H, 4.76 ppm, 2.6 H, s
C═C—H, 5.5-5.6 ppm, 51 H, hept
$^{13}$C NMR: Si—CH$_3$, −1.5, −1.3, −1.2 ppm, t
Si—H, 0.29 ppm, s
C═C, 132.2 ppm, m Based on the $^1$H NMR spectrum, the structure of ODCPDS is that shown below. Dicyclopentadiene does not react easily with all Si—H group on OHS partly because of the potential steric hindrance and also because it is a good ligand for the catalytic species, thereby slowing the reaction down. Other catalysts such as Pt or PtO$_2$ may provide superior results.

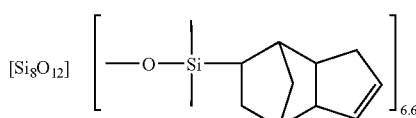
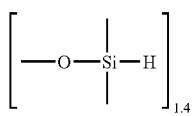

Example 12

Tetrakis(dicyclopentadienyldimethylsiloxy)tetrakis(hydridodimethyl-siloxy)octasilsesqui-oxane, TDCPDS

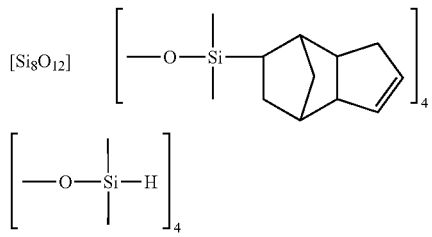

To a 100 ml Schlenk flask equipped with reflux condenser, is added OHSS (19.0 g, 19 mmol). The apparatus is then gently heated in vacuum to remove residual air and moisture and then flushed with nitrogen. Toluene (100 ml), dicyclopentadiene (9.9 g, 75 mmol) and 2 mM Pt(dvs)-toluene solution (0.2 ml, Pt: 0.4 ppm) as a catalyst, are added. The mixture is stirred at 90° C. for 6 h. After reaction, solvent is evaporated to yield a colorless viscous liquid, TDCPS. The yield is 28.2 g (18 mmol), 98%.

Analytical Data:
DTA-TGA: Td$_5$, 458° C., Ceramic yield: 63.5% (1000° C. in air, Calcd.: 62.1%)
DSC: Curing temp.: 180° C.
$^1$H NMR: Si—CH$_3$, 0.09 ppm, 22 H, d
H—Si—CH$_3$, 0.26 ppm, 23 H, s
Si—CH$_2$, 0.67 ppm, 4 H, d
Dicyclopentadienyl, 1.2 ppm-3.2 ppm, 40 H, m
Si—H, 4.75 ppm, 4 H, s
C═C—H, 5.4-5.8 ppm, 8 H, q
$^{13}$C NMR: Si—CH$_3$, 0.28 ppm, d
Dicyclopentadienyl, 14.8, 25.6, 28.7, 29.8, 31.8, 36.6 ppm, m
C═C, 127.0 ppm, d Based on $^1$H NMR spectrum and TGA-DTA data, the structure of DCPDS is that shown below.

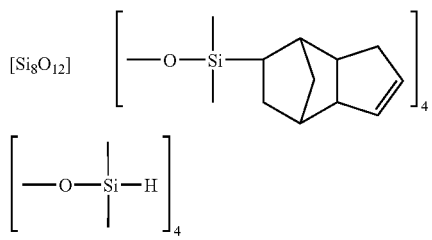

Example 13

Preparation of resin from TDCPDS

TDCPDS (1 g) is added to a 10 ml Teflon (23.3×18.3 mm ID) or aluminum cup (25.2×39.6 mm (ID) ). The cup is placed in a vacuum oven thermostatted at 85° C. Following degassing for a period of 2 h at 85° C., the oven is flushed with nitrogen. The temperature is then raised at 30° C./h to 200° C.

and held there for 10 to 24 h providing a white opaque (translucent) disk with thickness of 2-4 mm.

Analytical Data

DTA-TGA: $Td_5$: 414° C., Ceramic yield: 63.2% (1000° C. in air, Calcd.: 62.1%)

DMA: Tg: 170° C.

TMA: 106 ppm (from 50° to 100° C.)

Example 14

Synthesis of Octakis(bisdimethylsilylacetyldimethylsiloxy)-silsesquioxane, OBTMSAS

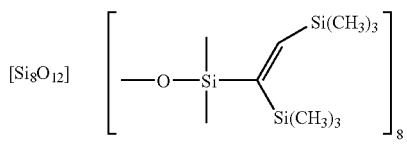

To a 100 ml Schlenk flask equipped with reflux condenser, is added OHSS (1 g, 1 mmol). The apparatus is then gently heated in vacuum to remove residual air and moisture and flushed with nitrogen. THF or toluene (25 ml), bistrimethylsilylacetylene (1.7 g, 10 mmol) and 2 mM Pt(dvs)-toluene solution (0.1 ml, Pt: 0.2 ppm) as a catalyst, are added.

The mixture is stirred at 60 or 90° C. for 6 h to 2 D. After reaction, triphenylphosphine and charcoal are then added to the solution to deactivate the catalyst and then filtered off through celite. Solvent was evaporated from filtrate to yield white opaque viscous liquid. The yield is 1.4 g (0.6 mmol), 58%.

Analytical Data

DTA-TGA: $Td_5$: 113° C., Ceramic yield: 76.0% (1000° C. in air, Calcd.: 85.6%). Some of the material sublimes during the TGA run as determined by a TGA run in nitrogen. This material offers potential for vapor deposition processes.

$^1$H NMR: Si—CH$_3$, 0.098 ppm, 61 H, s

HSi—CH$_3$, 0.27 ppm, 38 H, s

Si—H, 4.76 ppm, 5.8 H, s $^{13}$C NMR: Si—CH$_3$, 0.13 ppm, s

HSi—CH$_3$, 0.24 ppm, s

C=C, 114.0 ppm, s

FTIR: ν Si—H, 2148 cm$^{-1}$

ν C—H, 1411 cm$^{-1}$

ν Si—O—Si, 1141 cm$^{-1}$

Based on the $^1$H NMR spectrum and TGA-DTA data, the structure of OBTMSAS is that shown below. Bistrimethylsilylacetylene does not react stoichiometrically with all of reaction sites (Si—H group) on OHS even when excess bistrimethylsilylacetylene is added. This result is a combination of steric hindrance and the fact that the catalytically active species is bound with the vinyl groups which reduce its ability to catalyze the reaction.

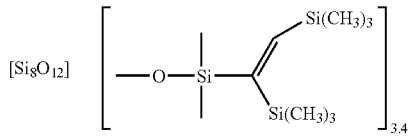

-continued

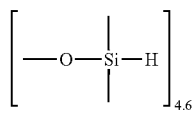

Example 15

Synthesis of Tetrakis(bisdimethylsilylacetynyldimethylsiloxy)-tetrakis(hydridodimethyl siloxy)octasilsesquioxane, TBTMSAS

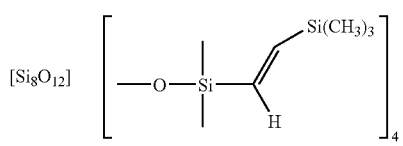

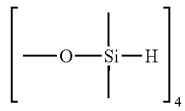

To a 100 ml Schlenk flask equipped with reflux condenser, is added OHSS (1 g, 1 mmol). The apparatus is then gently heated in vacuum to remove residual air and moisture and flushed with nitrogen. Then CH$_2$Cl$_2$, THF or toluene (25 ml), bistrimethylsilylacetylene (0.68 g, 4 mmol) and 2 mM Pt(dvs)-toluene solution (0.1 ml, Pt: 0.2 ppm) as a catalyst, are then added.

The mixture is stirred at 60 or 90° C. for 4 h to 5 d. After reaction, triphenylphosphine and charcoal are added and filtered off through celite. Solvent is then evaporated from filtrate at RT in vacuum to yield a white powder. The yields are 40, 68 and 68%, respectively.

Analytical Data

DTA-TGA: $Td_5$: 233° C., Ceramic yield: 74.1% (1000° C. in air, Calcd.: 81.1%). Some of the material sublimes during the TGA run as determined by a TGA run in nitrogen. This material offers potential for vapor deposition processes.

DSC: Curing temperature, 138° C.

$^1$H NMR: Si—CH$_3$, 0.162 ppm, 58 H, d

HSi—CH3, 0.225 ppm, 49 H, m

Si—H, 4.72 ppm, 5.2 H, s

=—Si, 7.41 ppm, 3.1 H, s $^{13}$C NMR: Si—CH$_3$, 1.03 ppm, m

=—Si, 164.7 ppm, s

FTIR: ν Si—H, 2140 cm$^{-1}$

ν C—H, 1420 cm$^{-1}$

ν Si—O—Si, 1100 cm$^{-1}$

Based on the $^1$H NMR spectrum and TGA-DTA data, the structure of TBTMSAS is determined to be that shown below. From this data less than four equivalents of bistrimethylsilylacetylene react with the Si—H groups on OHS even though four equivalents are added in the time allotted for the reaction to proceed.

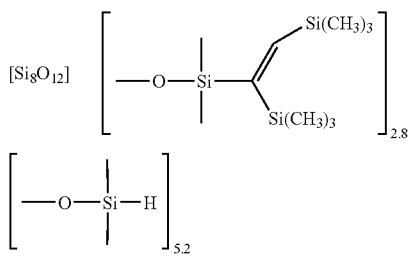

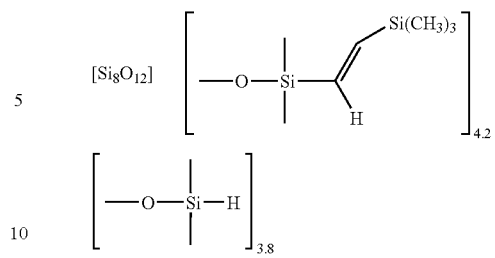

Example 16

Curing TBTMSAS

TBTMSAS (1 g) is added to a 10 ml Teflon (23.3×18.3 mm ID) or aluminum cup, (25.2×39.6 mm ID). The cup is placed in a vacuum oven thermostatted at 85° C. Following degassing for a period of 2 hr at 85° C., the oven is flushed with nitrogen. The temperature is then raised at 30° C./h up to 200° C. and held there for 10 to 24 h providing a white opaque (translucent) disk with thickness of 2-4 mm.

Analytical Data

DTA-TGA: $Td_5$: 238° C., Ceramic yield: 65.3% (1000° C. in air, calcd: 81.1%). Some of the material sublimes during the TGA run as determined by a TGA run in nitrogen. This material offers potential for vapor deposition processes.

Example 17

Octakis(trimethylsilylacetynyldimethylsiloxy)octasilsesquioxane or OTMSAS

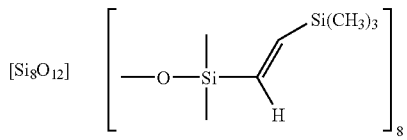

To a 100 ml Schlenk flask equipped with reflux condenser, is added OHSS (1 g, 1 mmol). The apparatus is then gently heated in vacuum to remove residual air and moisture and flushed with nitrogen. Then THF (25 ml), trimethylsilylacetylene (0.98 g, 10 mmol) and 2 mM Pt(dvs)-toluene solution (0.1 ml, Pt: 0.2 ppm) as a catalyst, are added.

The mixture is stirred at 60° C. for 3 h. After reaction, triphenylphosphine (5 mg) and charcoal (0.08 g) are then added to the solution to deactivate the catalyst and thereafter filtered off through celite. Solvent is evaporated to yield a white powder. The yield is 1.67 g (0.93 mmol), 93%.

Analytical Data

DTA-TGA: $Td_5$: 285° C., Ceramic yield: 58.8% (1000° C. in air, Calcd: 79.8%). Some of the material sublimes during the TGA run as determined by a TGA run in nitrogen. This material offers potential for vapor deposition processes.

$^1$H NMR: Si—$CH_3$, 0.07, 0.21 ppm, 8 H, d

H—C=C, 6.60 ppm, 1 H, q

Based on the $^1$H NMR and TGA-DTA data, the structure of OTMSAS is determined to be that shown below.

Example 18

Synthesis of Tetrakis(trimethylsilylacetynyl-dimethyl-siloxy)tetrakis(hydridodimethylsiloxy)octasilsesquioxane

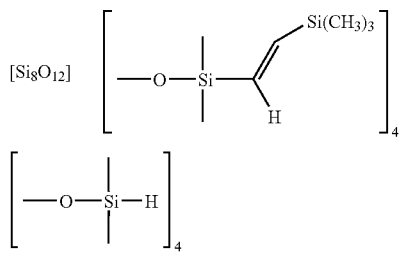

To a 100 ml Schlenk flask equipped with reflux condenser is added OHSS (10 g, 10 mmol). The apparatus is then gently heated in vacuum to remove residual air and moisture and flushed with nitrogen. Then THF (50 ml), trimethylsilylacetylene (3.86 g, 40 mmol) and 2 mM Pt(dvs)-toluene solution (0.1 ml, Pt: 0.2 ppm) as a catalyst, are added.

The mixture is stirred at 60° C. for 2 h. After reaction, solvent is evaporated at RT in vacuo to yield a white powder. The yield is 12.5 g (89 mmol), 88%.

Analytical Data

DTA-TGA: $Td_5$: 281° C., Ceramic yield: 75.6% (1000° C. in air, Calcd.: 84.7%). Some of the material sublimes during the TGA run as determined by a TGA run in nitrogen. This material offers potential for vapor deposition processes.

DSC: Mp: 87.2° C., Curing temperature: 130.1° C.

$^1$H NMR: Si($CH_3$)$_3$, 0.073 ppm, 35 H, d

Si($CH_3$)$_2$, 0.21 ppm, 26 H, s

HSi—$CH_3$, 0.25 ppm, 23 H, s

Si—H, 4.75 ppm, 3.6 H, s

C=C—H, 6.53 ppm, 8.1 H, q $^{13}$C NMR: Si($CH_3$)$_3$, −1.43 ppm, s

H—Si—$CH_3$, 0.39 ppm, d

C=C, 148.1, 152.7 ppm, d

FTIR: ν Si—H, 2140 cm$^{-1}$

δ =C—H, 1412 cm$^{-1}$

ν Si—O—Si, 1095 cm$^{-1}$

Based on the $^1$H NMR and TGA-DTA data, the structure of TTMSAS is determined to be as shown below.

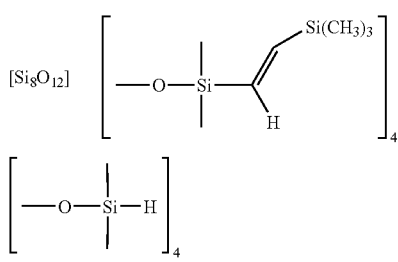

Example 19

Curing TTMSAS

TTMSAS (1 g) is added to a 10 ml teflon(23.3×18.3 mmID) or aluminum cup, (25.2×39.6 mm ID). The cup is placed in a vacuum oven thermostatted at 85° C. Following degassing for a period of 2 h at 85° C., the oven is flushed with nitrogen. The temperature is then raised at 30° C./h to 200° C. and held there for 10 to 24 h providing a white opaque (translucent) disk with thickness of 2-4 mm.

Analytical Data

TMA: CTE=212 ppm (between 50° and 100° C.)

Example 20

Synthesis of tetrakis(hydridodimethylsiloxy)octasilsesquioxane, NorbTHS

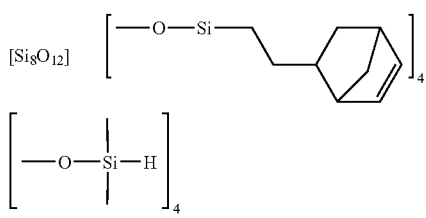

To a 100 ml Schlenk flask equipped with reflux condenser, is added OHS (1 g, 1 mmol). The apparatus is then gently heated in vacuum to remove residual air and moisture and flushed with nitrogen. Then THF (10 ml), 5-vinyl-2-norbornene (0.47 g, 3.9 mmol) and 2 mM Pt(dcp)-toluene solution (0.1 ml, Pt: 0.2 ppm) as a catalyst, are added.

The mixture is stirred at 60° C. for 5 h. After reaction, solvent is evaporated at RT in vacuo to yield white powder. The yield is 1.6 g (1 mmol), which is quantitative.

Analytical Data

DTA-TGA: $Td_5$: 302° C., Ceramic yield: 55.7% (1000° C., in air, Calcd.: 64.1%). Some of the material sublimes during the TGA run as determined by a TGA run in nitrogen. This material offers potential for vapor deposition processes.

$^1$H NMR: Difficult to assign $^{13}$C NMR: N/A

FTIR: ν=C—H: 3060 cm$^{-1}$

ν Si—H: 2140 cm$^{-1}$

δ =C—H: 1450 cm$^{-1}$

ν Si—O—Si: 1080 cm$^{-1}$

Example 21

Curing norbTHS

NorbTHS (1 g) is added to a 10 ml Teflon (23.3×18.3 m (ID) or aluminum cup (25.2×39.6 mm ID). The cup is placed in a vacuum oven thermostatted at 85° C. Following degassing for a period of 2 h at 85° C., the oven is flushed with nitrogen. The temperature is then raised at 30° C./h to 200° C. and held there for 10 to 24 h providing a white solid.

Example 22

Synthesis of Octakis(cyclohexenyldimethylsiloxy) octasilsesquioxane, OCHDS

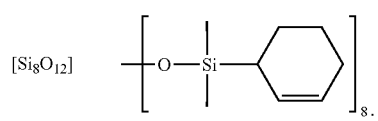

To a 100 ml Schlenk flask equipped with reflux condenser, is added OHSS (1 g, 1 mmol). The apparatus is then gently heated in vacuum to remove residual air and moisture and flushed with nitrogen. Then THF (10 ml), 1,3-cyclohexadiene (0.79 g, 10 mmol) and 2 mM Pt(dcp)-toluene solution (0.1 ml, Pt: 0.2 ppm) as a catalyst, are added.

The mixture is stirred at 60° C. for 3 h. After reaction, solvent is removed at RT in vacuo to yield white opaque viscous liquid. The yield is 1.80 g (1.13 mmol), quantitative.

Analytical Data

DTA-TGA: $Td_5$: 270° C., Ceramic yield: 52.7% (1000° C., in air, Calcd.: 57.9%). Some of the material sublimes during the TGA run as determined by a TGA run in nitrogen. This material offers potential for vapor deposition processes.

$^1$H NMR: Si—CH$_3$, 0.141 ppm, 48 H, s

Cyclohexane: 1.3-1.9 ppm 51 H, m

H—C=C, 5.67 ppm, 16 H, s $^{13}$C NMR: Si—CH$_3$, −1.4 ppm, s

Cyclohexane: 23.0, 23.4, 25.6, 27.9 ppm, s

C=C, 126.6, 127.2 ppm, d

FTIR: ν C=C—H, 3016 cm$^{-1}$

ν C=C—H, 1442 cm$^{-1}$

ν Si—O—Si, 1145 cm$^{-1}$

Based on $^1$H NMR and FTIR, the structure of OCHDS is that described below.

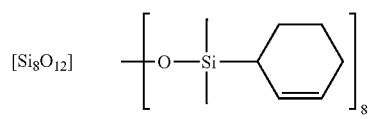

Example 23

Synthesis of Tetrakis(cyclohexenyldimethylsiloxy)tetrakis(hydrido-dimethylsiloxy)octasilses-quioxane, TCHDS

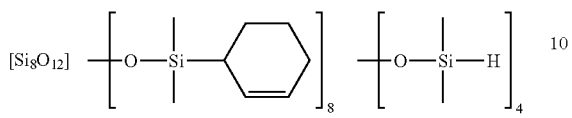

To a 100 ml Schlenk flask equipped with reflux condenser, is added OHSS (1 g, 1 mmol). The apparatus is then gently heated in vacuum to remove residual air and moisture and flushed with nitrogen. Then THF (10 ml), 1,3-cyclohexadiene (0.32 g, 4 mmol) and 2 mM Pt(dcp)-toluene solution (0.1 ml, Pt: 0.2 ppm) as a catalyst, are added.

The mixture is stirred at 60° C. for 3 h. After reaction, solvent is removed at RT in vacuo to yield white opaque viscous liquid. The yield is 1.40 g (1 mmol), essentially quantitative.

Analytical Data

DTA-TGA: $Td_5$: 238° C., Ceramic yield: 63.4% (1000° C., in air, Calcd.: 65.8%)

$^1$H NMR: Si—CH$_3$, 0.141 ppm, 32 H, s

HSi—CH$_3$, 0.252 ppm, 14 H, s

Cyclohexane: 1.3-1.9 ppm, 57 H, m

Si—H, 4.74 ppm, 2.6 H, s

H—C=C, 5.67 ppm, 11 H, s $^{13}$C NMR: Si—CH$_3$, −1.4 ppm, s

HSi—CH$_3$, 0.73 ppm, s

Cyclohexane: 23.0, 23.4, 25.6, 27.9 ppm, s

C=C, 126.6, 127.2 ppm, d

FTIR: ν C=C—H, 3016 cm$^{-1}$

ν Si—H 2152 cm$^{-1}$

ν C=C—H, 1438 cm$^{-1}$

ν Si—O—Si, 1146 cm$^{-1}$

Based on $^1$H NMR spectrum, the structure of TCHDS is determined to be as shown below.

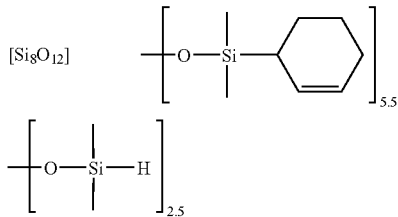

Example 24

Curing TCHDS

TCHDS (1 g) is added to a 10 ml Teflon (23.3×18.3 m (ID) or aluminum cup (25.2×39.6 mm ID). The cup is placed in a vacuum oven thermostatted at 85° C. Following degassing for a period of 2 h at 85° C., the oven is flushed with nitrogen. The temperature is then raised at 30° C./h to 200° C. and held there for 10 to 24 h providing a white opaque (translucent) disk with thickness of 2-4 mm.

Analytical Data

DTA-TGA: $Td_5$: 349° C., Ceramic yield: 66.7% (1000° C. in air, calcd: 65.8%)

TMA: CTE=180 ppm

Example 25

Synthesis of Tetrakis(vinyldimethylsiloxy)tetrakis(hydridodimethyl-siloxy)silsesquioxane, TViTHS

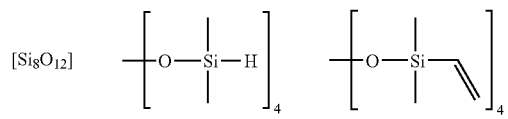

To a 500 ml Schlenk flask equipped with additional funnel, is added hexane (130 ml), dimethylchlorosilane (3.74 g, 31 mmol) and dimethylvinylchlorosilane (2.93 g, 31 mmol).

The mixture is cooled to 0° C. An octaanion/methanol solution (50 ml, 6.2 mmol) is then added dropwise over a period of 40 min. After the addition was complete, the mixture is stirred at 0° C. for another 30 min and then at RT for 5 h.

The hexane layer is separated and dried over Na$_2$SO$_4$ and then removed via rotary evaporator to produce white TViTHS powder. The yield is 4.46 g (3.8 mmol) 64%.

Interestingly, the molar ratio of dimethylchlorosilane and dimethylvinylchlorosilane directly affects the ratio of substitution ratio on synthesized compound. For example, when the ratio of dimethylchlorosilane/dimethyl-vinylchlorosilane/octaanion silsesquioxane=5/5/1 described above, the ratio of dimethylsilyl group/dimethylvinylsilyl group on obtained compound is 4.02/3.98 based on $^1$H NMR spectrum. The determined structure is shown below. On the other hand, if the ratio is changed to the ratio dimethylchlorosilane/dimethylchlorosilane/octaanion=4/5/1, the ratio of dimethylvinylsilyl group to dimethylsilyl group is 3.26/4.74. This means that the composition of the groups on the cube is very easily modified.

Analytical Data

DTA-TGA: $Td_5$: 132° C., Ceramic yield: 79.2% (1000° C. in air, Calcd.: 85.6%). Some of the material sublimes during the TGA run as determined by a TGA run in nitrogen. This material offers potential for vapor deposition processes.

DSC: Curing temperature: 207° C.

$^1$H NMR: =Si—CH$_3$, 0.16 ppm, 25 H, s

H—Si—CH$_3$, 0.20 ppm, 23 H. s

Si—H, 4.75 ppm, 4 H, s

C=C—H, 5.7-6.2 ppm, 11 H, m $^{13}$C NMR: SiCH$_3$, −0.07 ppm, 0.28 ppm, d

C=C, 132.7 ppm, 138.1 ppm, d

FTIR: ν=C—H, 3050 cm$^{-1}$

ν Si—H, 2140 cm$^{-1}$

δ =C—H, 1412 cm$^{-1}$

ν Si—O—Si, 1191 cm$^{-1}$

Based on the $^1$H NMR spectrum and TGA-DTA data, the structure of TViTHS was determined to be as shown below.

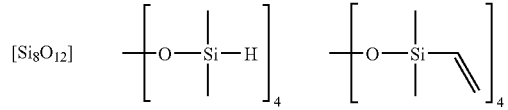

Example 26

Curing TViTHS

TViTHS (1 g) is added to a 10 ml Teflon (23.3×18.3 mm ID) or aluminum cup (25.2×39.6 mm ID). The cup is placed in a vacuum oven thermostatted at 60° C. Following degassing for a period of 2 h at 85° C., the oven is flushed with nitrogen. The temperature is then raised at 30° C./h to 200° C. and held there for 10 to 24 h providing a white opaque (translucent) disk with thickness of 2-4 mm.

Analytical Data

DTA-TGA: $Td_5$: 395° C., Ceramic yield: 71.8% (1000° C. in air, Calcd: 85.6%). Some of the material sublimes during the TGA run as determined by a TGA run in nitrogen. This material offers potential for vapor deposition processes.

Example 27

Synthesis of Tetrakis(allyldimethylsiloxy)tetrakis-(hydridodimethylsiloxy)silsesquioxane, TallylTHS

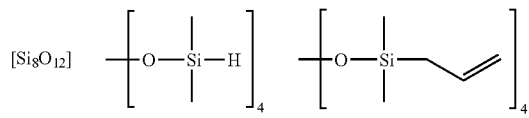

To a 250 ml Schlenk flask equipped with additional funnel, is added hexane (65 ml), dimethylchlorosilane (1.47 g, 16 mmol) and dimethylallylchlorosilane (2.09 g, 16 mmol). The mixture is cooled at 0° C. and an octaanion/methanol solution (25 ml, 3.1 mmol) is then added dropwise over a period of 20 min. After the addition is complete, the mixture is stirred at 0° C. for another 30 min and then at RT for 24 h.

The hexane layer is separated and dried over $Na_2SO_4$ and then removed via rotary evaporator to produce transparent TallylTHS liquid. The yield is 2.84 g (2.4 mmol), 78%.

Analytical Data

DTA-TGA: $Td_5$: 174° C., Ceramic yield: 78.0% (1000 OC in air, Calcd.: 80.4%). Some of the material sublimes during the TGA run as determined by a TGA run in nitrogen. This material offers potential for vapor deposition processes.

DSC: Curing temperature: 208° C.

$^1$H NMR: -Si—$CH_3$, 0.085, 0.17 ppm, 28 H, d
H—Si—$CH_3$, 0.26 ppm, 20 H, s
—$CH_2$-$SiCH_3$, 1.65 ppm, 8 H, dd
Si—H, 4.76 ppm, 4 H, s
=$CH_2$, 4.85 ppm, 8 H, m
=CH, 5.80 ppm, 4 H, m $^{13}$C NMR: $SiCH_3$, −0.35 ppm, 0.62 ppm, d
Si—$CH_2$-, 26.1 ppm, d
C=C, 114.1 ppm, 134.5 ppm, dd FTIR: ν O-H, 3700 $cm^{-1}$
ν=C—H, 3075 $cm^{-1}$
ν Si—H, 2145 $cm^{-1}$
δ =C—H, 1412 $cm^{-1}$
ν Si—O—Si, 1150 $cm^{-1}$ When the ratio of dimethylallylchlorosilane/dimethylchloro-silane/octaanion is 5/5/1, the ratio of dimethylallylsilyl to dimethylsilyl groups substituted on octaanion is 3.7/3.7 as described above and remaining positions may be OH groups from unreacted sites on octaanion based on $^1$H NMR and FTIR data. The determined structure is shown below. On the other hand, when the ratio is changed to 6/5/1 (dimethylallylchlorosil-ane/dimethylchlorosilane/octaanion), the ratio of dimethylallylsilyl to dimethylsilyl groups is 4.2/3.1 with some residual OH groups as suggested by the $^1$H NMR and FTIR data. In this system, it is as easy to modify the ratio and type of reactant organic groups. No efforts have been made to optimize this synthesis.

Based on the $^1$H NMR spectrum and TGA-DTA data, the structure of AllylTHS is determined to be as shown below. Under the conditions chosen here, all of organic group do not react with all possible reaction sites on octaanion.

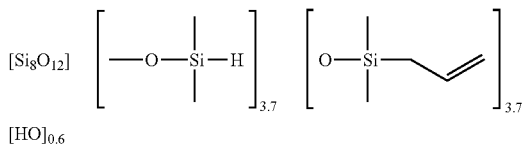

Example 28

Curing TAllylTHS

TAllylTHS (1 g) is added to a 10 ml Teflon (23.3×18.3 mm ID) or aluminum cup (25.2×39.6 mm ID). The cup is placed in a vacuum oven thermostatted at 85° C. Following degassing for a period of 2 h at 85° C., the oven was flushed with nitrogen. The temperature is then raised at 30° C./h to 200° C. and held there for 10-24 h providing a brown opaque disk with thickness of 2-4 mm.

Analytical Data

DTA-TGA: $Td_5$:345° C., Ceramic yield: 82.5% (1000° C. in air, Calcd: 81.5%)

TMA: CTE=227 ppm (at the range between 50 and 100° C.)

Example 29

Synthesis of Tetrakis(hexenyldimethylsiloxy)tetrakis(hydridodimethylsiloxy)silsesquioxane, THexenylTHS

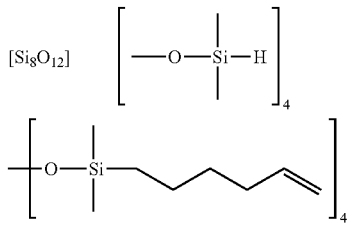

To a 250 ml Schlenk flask equipped with additional funnel, Is added hexane (65 ml), dimethylchlorosilane (1.84 g, 0.019 mol) and dimethylhexenylchlorosilane (3.42 g, 0.019 mol). The mixture Is cooled at 0° C. and an octaanion/methanol solution (25 ml, 0.0031 mol) Is added dropwise over a period of 20 min. After the addition was complete, the mixture is stirred at 0° C. for another 30 min and then at RT for 24 h.

The hexane layer is separated and dried over $Na_2SO_4$ and then removed via rotary evaporator to produce transparent ThexenylTHS liquid. The liquid is purified by washing with methanol/aeetonitrile (1:1 by volume) giving a yield of 4.68 g (3.5 mmol) 90%.

Analytical Data

DTA-TGA: $Td_5$:95° C., Ceramic yield: 51.9% (1000° C. in air, Calcd.: 71.3%). Some of the material sublimes during the TGA run as determined by a TGA run in nitrogen. This material offers potential for vapor deposition processes.

DSC: Curing temperature, 224° C.

$^1$H NMR: —Si—$CH_3$, 0.085, 0.11, 0.14, 0.18 ppm, 32 H, dd

H—Si—$CH_3$, 0.26 ppm, 16 H, s
    —$CH_2$—$SiCH_3$, 0.55 ppm, 8 H, m
    —$CH_2$-$CH_2$, 1.40 ppm, 17 H, broad
    —$CH_2$—CH=$CH_2$, 2.06 ppm, 8 H, broad
    —Si—H, 4.75 ppm, 3.4 H, d
    =$CH_2$—, 4.96 ppm, 7 H, m
    =CH—, 5.82 ppm, 3.6 H, m $^{13}$C NMR: Si—$CH_3$, −0.47 ppm, −0.02 ppm, d
    —$CH_2$—, 17.4 ppm, 22.4 ppm, 32.5 ppm, 33.4 ppm, d
    =$CH_2$—, 114.1 ppm, s
    =CH—, 138.9 ppm, s
FTIR: ν=C—H, 3074 $cm^{-1}$
ν Si—H, 2140 $cm^{-1}$
δ =C—H, 1412 $cm^{-1}$
ν Si—O—Si, 1150 $cm^{-1}$ Based on the $^1$H NMR spectrum, the structure of ThexenylTHS is determined to be as shown above.

When the ratio of dimethylhexenylchlorosilane/dimethylchloro-silane/octaanion is 5/5/1, the ratio of dimethylhexenylsilyl to dimethylsilyl groups on the obtained product is 3.6/3.4. Residual OH groups make up the remaining reactive sites based on $^1$H NMR and FTIR data. The determined structure is shown above. When the ratio of dimethylhexenylchlorosilane/dimethylchloro-silane/octaanion is 6/5/1, the ratio of dimethylhexenylsilyl to dimethylsilyl groups on the product is 4.1/2.9. The remaining groups are SiOH. Thus, the initial ratio affects the substitution ratio of the final product. In this system it is easy to modify the substitution ratio in TViTHS like the TallylTHS system described above.

Example 30

Curing ThexenylTHS

ThexenylTHS (1 g) is added to a 10 ml Teflon (23.3×18.3 mm ID) or aluminum (25.2×39.6 mm ID). The cup is placed in a vacuum oven thermo-statted at 60° C. Following degassing for a period of 2 h at 85° C., the oven is flushed with nitrogen. The temperature is then raised at 30° C./h up to 200° C. and held there for 10 to 24 h providing a colorless transparent disk with thickness around 2-4 mm.
Analytical Data DTA-TGA: $Td_5$: 468° C., Ceramic yield: 76.5% (1000° C. in air, Calcd: 71.3%).
TMA: CTE=277 ppm (between 50° and 100° C.)

Example 31

Melt Curing OVS/OHS Mixtures

Octakis(vinyldimethylsiloxy)silsesquioxane (OVS, 1.5 g, 1.2 mmol) and Octakis(hydridodimethylsiloxy)ostasilsesquioxane (OHS, 1.25 g, 1.2 mol) are mixed with mortar and pestle. The mixture is placed in a 10 ml Aluminum cup (25.2×39.6 mm ID). The cup is placed in a vacuum oven at room temperature. Then the oven is flushed with nitrogen and the temperature raised at 30° C./h up to 360° C. and held there for 10 to 24 h providing a colorless transparent disk 2-4 mm thickness.
Analytical Data DTA-TGA: $Td_5$: 450° C., Ceramic yield: 78.3% (1000° C. in air, Calcd: 85.6%)
TMA: CTE=180 ppm (between 50° and 100° C.)

Example 32

Synthesis of Tris(dimethylethoxysilylethyldimethylsiloxy)pentakis(hydridodimethylsiloxy)-silsesquioxane, TrisViMe$_2$SiOEtS To a 250 ml Schlenk flask equipped with reflux condenser, is added OHSS (10 g, 10 mmol). The apparatus is then gently heated in vacuum to remove residual air and moisture and then flushed with nitrogen. Then toluene (50 ml), dimethylvinylethoxysilane (3.91 g, mmol) and 2 mM Pt(dvs)-toluene solution (0.1 ml, Pt: 0.2 ppm) as a catalyst, are added. The mixture is stirred at 90° C. for 2 h. After reaction, solvent is evaporated at RT in vacuo to yield a transparent viscous liquid, 11.2 g (74 mmol), 72%.
Analytical Data DTA-TGA: $Td_5$:268° C., Ceramic yield: 67.5% (1000° C. in air, Calcd.: 74.1%). Some of the material sublimes during the TGA run as determined by a TGA run in nitrogen. This material offers potential for vapor deposition processes.

DSC: Endothermic peaks, 55° C., 92° C., 127° C.

$^1$H NMR: EtOSi$CH_3$, 0.10 ppm, 21 H, s
    —Si$CH_3$, 0.14 ppm, 21 H, s
    H—Si—$CH_3$, 0.25 ppm, 24 H, s
    Si—$CH_2$—$CH_2$—Si 0.53 ppm, 14 H, s
    O$CH_2$—$CH_3$, 1.19 ppm, 10 H, t
    O—$CH_2$—, 3.66 ppm, 7 H, q
    Si—H, 4.74 ppm, 4 H, s $^{13}$C NMR: —Si—$CH_3$, −1.33 ppm, −0.87 ppm, 0.26 ppm, t
    —$CH_2$—, 9.14 ppm, d
    $CH_3$—$CH_2$—, 18.5 ppm, s
    —O$CH_2$—, 58.3 ppm, s

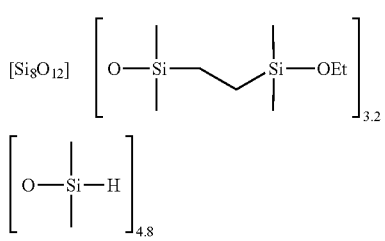

Based on the ¹H NMR spectrum, the structure of TrisViMe₂SiOEtS is determined to be as shown above.

Example 33

Tris(dimethylethoxysilylethyldimethylsiloxy)pentakis(hydridodimethylsiloxy)-silsesquioxane, (partially hydrolyzed TrisViMe₂SiOEtS)

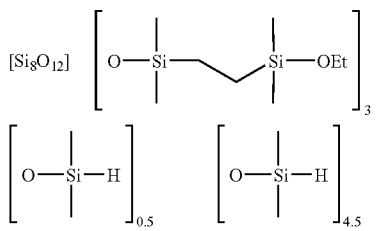

To a 100 ml flask equipped with reflux condenser, are added TrisViMe₂SiOEtS (5.6 g, 3.6 mmol) and THF (20 ml). The mixture is then cooled at 0° C. for 30 min. 0.1 N HCl acq (0.43 ml) is added into the flask and the solution stirred at 0° C. for 30 min and at RT for 30 min. The mixture is stirred at 60° C. for 1 d to complete the hydrolysis.

Analytical Data

DTA-TOA: Td₅: 273° C., Ceramic yield: 78.2% (1000° C. in air, Calcd.: 77.0%)

¹H NMR: —OSiCH₃, 0.10 ppm, 30 H, s
—SiCH₃, 0.14 ppm, 20 H, s
H—Si—CH₃, 0.25 ppm, 17 H, s
Si—CH₂—CH₂—Si, 0.53 ppm, 14 H, s
OCH₂—CH₃, 1.19 ppm, 10 H, t
O—CH₂—, 3.66 ppm, 7 H, q
Si—H, 4.74 ppm, 3 H, s
¹³C NMR: N/A
FTIR: ν —OH, 3340 cm⁻¹
ν Si—O—Si, 1145 cm⁻¹

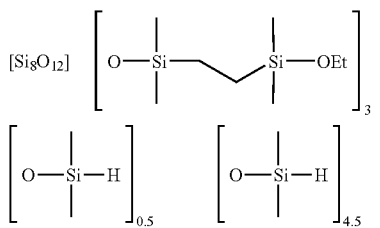

Based on the ¹H NMR spectrum, the structure of partial hydrolyzed TrisViMe₂SiOEtS is determined to be that shown above.

Example 34

Curing Partially Hydrolyzed TrisViMe₂SiOEtS

TrisViMe₂SiOEtS (1 g) is added to a 10 ml teflon cup (23.3×18.3 mm ID). The cup is placed in a vacuum oven thermostatted at 30° C. to evaporate solvent over 2 h. Then the oven ambient pressure was restored. The temperature is raised at 30° C./h to 150° C. and held therefor 10 to 24 h providing a colorless transparent disk 2-4 mm thick.

Analytical Data

DTA-TGA: Td₅: 297° C., Ceramic yield: 80.0% (1000° C. in air, Calcd.: 74.1%)

FTIR: ν —OH, 3640, 3380 cm⁻¹
ν Si—H, 2140 cm⁻¹
ν Si—O—Si, 1072 cm⁻¹
TMA: 215 ppm (at the range between 50 and 100° C.)

Example 35

Tris(dimethylethoxysilylethyldimethylsiloxy)pentakis(trimethylsilylethyl-dimethylsiloxy)silsesquioxane, (TrisSiOEtPentakisSiMe₃S)

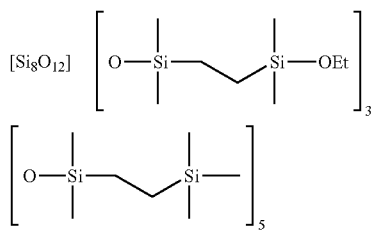

To a 100 ml flask equipped with reflux condenser, is added TrisViMe₂SiOEtS (2.2 g, 0.0015 mol). The apparatus is then gently heated in vacuum to remove residual air and moisture and then flushed with nitrogen. Then toluene (10 ml), trimethylvinylsilane (0.87 g, 0.0087 mol) and 2 mM Pt(dvs)-toluene solution (0.1 ml, Pt: 0.2 ppm) as a catalyst, are added. The mixture is stirred at 90° C. for 3 h. After reaction, solvent was evaporated at RT in vacuo to yield a transparent liquid. The yield is 3.5 g (1.9 mmol).

Analytical Data

¹H NMR: Si(CH₃)₃, −0.02 ppm, 38H, s
—SiOEt, 0.10 ppm, 21 H, s
—Si(CH₃)₂—, 0.13 ppm, 47 H, s
—CH₂—CH₂—, 0.52 ppm, 32 H, s
OCH₂—CH₃, 1.19 ppm, 9 H, t
O—CH₂—, 3.66 ppm, 6 H, q
FTIR: ν CH: 2960, 2900 cm⁻¹
ν Si—O—Si: 1145 cm⁻¹

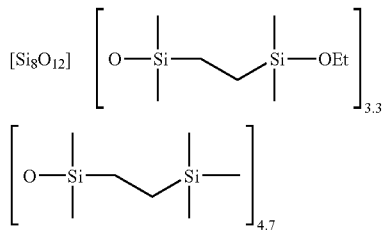

Based on the ¹H NMR spectrum, the structure of partial hydrolyzed TrisViMe₂SiOEtS is determined to be as shown above.

Example 36

Tris(dimethylethoxysilylethyldimethylsiloxy)pentakis-(trimethyl-silylethyldimethylsiloxy)silsesquioxane, (Partially hydrolyzed TrisSiOEtPentakisSiMe₃S)

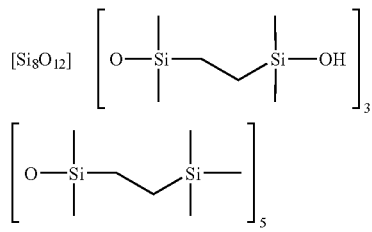

To a 100 ml flask equipped with reflux condenser, are added TrisSiOEtPentakisSIMe₃S (5 g, 0.0025 mol) and THF (15 ml). The mixture is then cooled at 0° C. for 30 min. 1 N HCl$_{aq}$ (0.025 ml) and H₂O (0.11 g) were added to the flask and stirred at 0° C. for 30 min and at RT for 30 min. Then the mixture was further hydrolyzed by stirring at 60° C. for 1 d.

Analytical Data

DTA-TGA: Td₅: 334° C., Ceramic yield: 61.0% (1000° C. in air, Calcd: 78.9%). Some of the material sublimes during the TGA run as determined by a TGA run in nitrogen. This material offers potential for vapor deposition processes.

¹H NMR: —Si—(CH₃)₃, −0.02 ppm, 38 H, s
EtOSi—CH₃, 0.05 ppm, 19 H, s
CH₂Si—CH₃, 0.13 ppm, 51 H, s
CH₂—Si(CH₃), 1.20 ppm, 1 H, broad

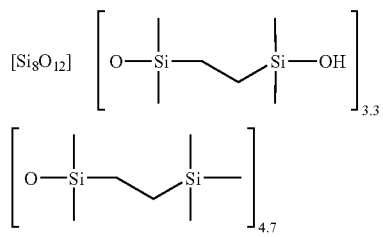

Based on the ¹H NMR spectrum, the structure of partial hydrolyzed TrisViMe₂SiOEtS is determined to be as shown above.

Example 37

Curing TrisSiOEtPentakisSiMe₃S

TrisSiOEtPentaldsSiMe₃S solution and 1 wt. % dibutyl tin dilaurate as a curing catalyst are added to 10 ml Teflon (23.3× 18.3 mm ID). The cup is placed in a vacuum oven thermostatted at 30° C. to evaporate solvent. Then the oven pressure is returned to ambient. The temperature is raised at 30° C./h up to 150° C. and held there for 10 to 24 h providing an opaque disk 2.0-4.0 mm thick.

Analytical Data

DTA-TGA: Td₅: 334° C., Ceramic yield: 61.0% (1000° C. in air, Calcd.: 80.2%). Some of the material sublimes during the TGA run as determined by a TGA run in nitrogen. This material offers potential for vapor deposition processes.

FTIR: ν —OH, 3710 cm⁻¹
ν Si—O—Si, 1084 cm⁻¹
TMA: 483 ppm (between 50 and 100° C.)

Example 38

Synthesis of TCHS with PtO₂

To a 250 ml Schlenk flask equipped with reflux condenser, are added octahydridosilsesquioxane OHS (10 g, 10 mg) and PtO₂ (0.02, 0.01, 0.005 g, Pt content: 0.08, 0.04, 0.02 mol, respectively) as a catalyst. The apparatus is degassed and heated under vacuum to eliminate residual air and moisture and then flushed with nitrogen. Toluene (50 ml), 5-vinyl-1-cyclohexene (4.3 g, 40 mg) are then added to the flask.

The mixture is stirred at 100° C. for 5 h. Then solution is filtered on celite to remove catalyst and filtrate is evaporated for 30 min in vacuum and then precipitated into acetonitrile to receive white powder. The yield is 47%. The powder is TCHS.

Analytical Data

DTA-TGA: Tg₅: 454° C. (in N₂)
367° C. (in air)
Ceramic yield: 66.9% (1000° C. in air, Calcd.: 67%)
DSC:Mp: 76.3° C.
Curing temperature: 180° C.
¹H NMR spectrum: Si—CH₃, 0.15 ppm, 24 H
H—SiCH₃, 0.26 ppm, 23 H
Si—CH₂, 0.65 ppm, 9.5 H
Cyclohexenyl, 1.2-2.1 ppm, 48 H
Si—H, 4.74 ppm, 4 H
Vinyl in cyclohexenyl, 5.66 ppm, 8H
¹³C NMR spectrum: Si—CH₃, 0.18 ppm
H—Si—Ch₃, 0.73 ppm
Si—CH₂, 15.3 ppm
Cyclohexenyl 29.1, 30.2, 32.2, 37.0 ppm
Vinyl in cyclohexenyl, 127.5 ppm
IR spectroscopy: =C—H, 3020 cm⁻¹
SiH, 2200 cm⁻¹
Si—O—Si, 1095 cm⁻¹

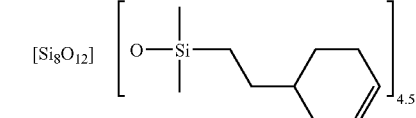
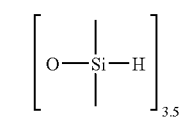

Example 39

Preparation of Resin from PtO₂-prepared TCHS

TCHS (≈1 g) as prepared in Example 28 is added to a 10 ml Teflon [23.3×18.3 mm ID] or aluminum cup (25.2×39.6 mm ID). The cup is placed in vacuum oven thermostatted at 85° C. Following degassing for 2 h at 85° C., the oven is flushed with nitrogen. The temperature is then raised at 30° C./h to 200° C.

and held there for 10 to 24 h overnight providing a transparent disk with thickness of 2.0-4.0 mm.
CTE (50° C.-100° C.): 126 ppm Example 40

A catalyst deactivating agent may be added to lower the room temperature reactivity. However, the reactivity can also be controlled by storing at lower temperatures, or the catalyst can be removed by passing through a column designed to capture the catalyst. Alternatively, the amount of deactivating agent can be minimal such that at higher temperatures, reaction will proceed. In some instances exposure to air or water can oxidize or decompose the deactivating agent. Furthermore, while triphenylphosphine is used above, it is meant only to be representative of a large group of hydrosilylation catalyst deactivators that those practiced in the art will recognize. For instance, other possible deactivators include other phosphines, arsines, stibnines, alkali cyanides, etc that will not also react with the cube macromonomers but can deactivate the transition metal complex- by exchange reaction of ligands.

Figure 4:
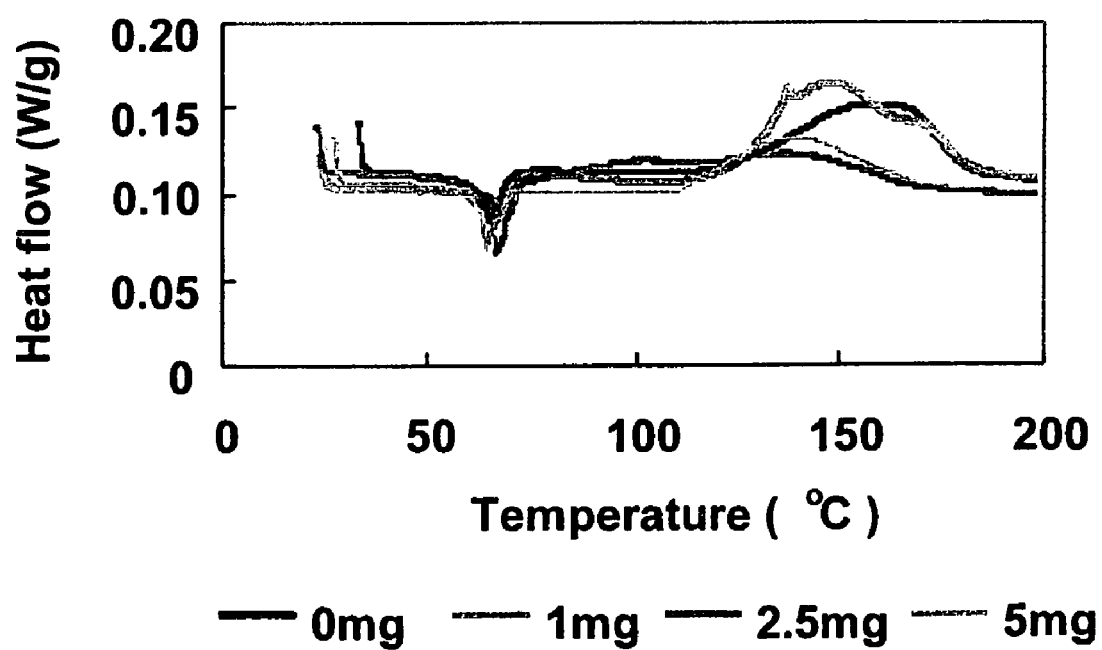
FIG. 4 illustrates cure employing various amounts of catalyst deactivators, as measured by DSC.

FIG. 4, shows how the amount of deactivating agent (triphenylphosphine provides an example) controls reaction at 150° C. From FIG. 4, the endotherm at ≈70C indicates melting. Depending on the amount of deactivator added, an exotherm corresponding to curing appears between 120° and 180° C. The intensity of the exotherm correlates with the inverse amount of deactivator used. From this data, less than 1 mg of deactivating agent is preferred when triphenylphosphine is added. Amounts used for other deactivators will vary with the type and the curing conditions desired.

TCHS will cure above 80° C. to a rigid body with less than 1 mg (0.09 mol % to the TCHS) deactivation agent, although the hybrid does not fully cure even at 200° C., overnight with more than 2.5 mg (0.2 mol % to TCHS) deactivation agent. Based on these results, the amount of deactivation agent serves an important role to prepare fully cured materials. In addition, the deactivator also will control the temperature required or the time required to fully cure these materials. Likewise, it will affect the rate of cure in the presence or absence of oxygen.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A process for preparing an organic-inorganic hybrid polymer UV protective material, comprising:
   a) providing one or more polyhedral silsesquioxanes [SiO1.5]n where n=6, 8, 10, or 12;
   b) functionalizing said polyhedral silsesquioxane with a plurality of —SiMe2R groups to form functional polyhedral silsesquioxane macromonomers wherein R includes $R^1$ group and $R^2$ group which are different from each other and reactive with each other; and
   c) reacting $R^1$ and $R^2$ groups of the functional polyhedral silsesquioxane macromonomer respectively with $R^2$ and $R^1$ groups of the adjacent functional polyhedral silsesquioxane macromonomer in order to bond the functional polyhedral silsesquioxane macromonomers and produce a cured organic-inorganic hybrid polymer,
   wherein said step of functionalizing takes place in the presence of as catalyst which accelerates the reaction of said polyhedral silsesquioxane with functionalizing reagents which supply $R^1$ and $R^2$ groups, and after reaching a target ratio of $R^1$ and $R^2$ groups, an amount of catalyst deactivator is added which only partially deactivates said catalyst such that the macromonomer(s) are storage stable and yet still crosslinkable.

2. The process of claim 1, wherein said $R^1$ and $R^2$ groups are each selected from the group consisting of Si-bonded H, halo, $OR^3$ (where $R^3$ is H or alkyl), alkenyl, alkynyl, and cycloalkenyl.

3. The process of claim 1, wherein said functional polyhedral silsesquioxane additionally includes to non-reactive R group which is selected from the group consisting of alkyl, cycloalkyl, trialkylsilyl, and trialkylsilyl-terminated (poly)siloxy.

4. The process of claim 1, wherein one of said $R^1$ and $R^2$ groups is Si-bonded H, the other is introduced by reacting polyhedral silsesquioxane bearing Si—H groups with a functionalizing reagent selected from the group consisting of dicyclopentadiene, bis(trimethylsilyl)acetylene, trimethylsilylacetylene, cyclohexadiene, 5-vinyl-2-norhornene and mixtures thereof.

5. The process of claim 1, wherein the ratio of $R^1$ group to $R^2$ group is from 0.25:1 to 1:1.

6. The process of claim 1, wherein said catalyst comprises a transition metal.

7. The process of claim 6, wherein at least one catalyst comprises Pt(dvs) or Pt(dcp), or PtO2.

8. The process of claim 1, wherein catalyst comprises Pt(dvs) or Pt(dcp), said catalyst deactivator comprises triphenylphosphine, and the molar amount of triphenylphosphine relative to silsesquioxane macromonomer) is greater than 0% and less than 0.09%.

9. The process of claim 1, wherein prior to or during said step of (c), at least one catalyst effective to accelerate the reaction of $R^1$ groups with reactive $R^2$ groups is added.

10. The process of claim 1, wherein said step (c) takes place in a melt of silsesquioxane macromonomer(s).

11. The process of claim 1, wherein said step (c) takes place in a solution comprising silsesquioxane monomer(s).

12. The process of claim 1, wherein said step (c) takes place in a liquid phase.

13. An organic-inorganic hybrid polymer material comprising, a plurality of identical or different covalently bonded polyhedral silsesquioxane macromonomer-derived moieties of the formula

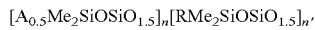

where n is a positive whole number, n' is 0 or a positive whole number and the sum n+n' is 6, 8, 10, or 12,
R is a non-reactive organic group or an unreacted reactive functional group $R^1$ or $R^2$, and
A is a divalent bridging group linking two polyhedral silsesquioxane moieties and derived from the reaction of two interreactive groups $R^1$ and $R^2$ which are different from each other, each macromonomer possessing, on average, both $R^1$ and $R^2$ groups,
wherein one of said reactive functional groups is hydroxyl group, the other is alkoxy group, said alkoxy group is derived from reaction of silicon-bonded H with one or more functionalizing reagents selected from the group consisting of dimethylvinylmethoxysilane and dimethylvinylethoxysilane, and said hydroxyl group is obtained by hydrolysis as an alternative to Si-bonded H.

14. A process for preparing an organic-inorganic hybrid polymer UV protective material, comprising:

a) providing one or more polyhedral silsesquioxanes [SiO1.5]n where n=6, 8, 10, or 12;
b) functionalizing said polyhedral silsesquioxane with a plurality of —SiMe2R groups to form functional polyhedral silsesquioxane macromonomers wherein R includes $R^1$ group and $R^2$ group which are different from each other and reactive with each other; and
c) reacting $R^1$ and $R^2$ groups of the functional polyhedral silsesquioxane macromonomer respectively with $R^2$ and $R^1$ groups of the adjacent functional polyhedral silsesquioxane macromonomer in order to bond the functional polyhedral silsesquioxane macromonomers and produce a cured organic-inorganic hybrid polymer,
wherein said step of functionalizing takes place in the presence of a catalyst which accelerates the reaction of said polyhedral silsesquioxane with functionalizing reagents which supply $R^1$ and $R^2$ groups, and after reaching a target ratio of $R^1$ and $R^2$ groups, the macromonomer(s) are precipitated from a solvent and the precipitate is washed with the same or to different solvent to provide a purified, storage stable solid macromonomer composition.

15. The process of claim 14, wherein at least one solvent is selected from the group consisting of alcohols, nitriles, ethers, sulfoxides, and amides.

16. The process of claim 14, wherein said purified macromonomer is dissolved, in a solvent, precipitated, and the precipitate washed with further solvent to form a more highly purified macromonomer composition, and wherein said steps of dissolving, precipitation, and washing are repeated more than two times.

* * * * *